(12) United States Patent
Hieda et al.

(10) Patent No.: US 7,579,241 B2
(45) Date of Patent: Aug. 25, 2009

(54) SEMICONDUCTOR DEVICE AND METHOD OF MANUFACTURE THEREOF

(75) Inventors: Katsuhiko Hieda, Yokohama (JP); Daisuke Hagishima, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 143 days.

(21) Appl. No.: 11/790,391

(22) Filed: Apr. 25, 2007

(65) Prior Publication Data

US 2007/0287245 A1 Dec. 13, 2007

Related U.S. Application Data

(62) Division of application No. 11/064,453, filed on Feb. 24, 2005, now Pat. No. 7,224,019.

(30) Foreign Application Priority Data

Feb. 24, 2004 (JP) .............................. 2004/048170

(51) Int. Cl.
*H01L 21/8247* (2006.01)
(52) U.S. Cl. ................ 438/259; 438/264; 257/E21.176
(58) Field of Classification Search ......... 438/257–267; 257/E21.176
See application file for complete search history.

(56) References Cited

U.S. PATENT DOCUMENTS

| | | | |
|---|---|---|---|
| 4,979,014 A | | 12/1990 | Hieda et al. |
| 5,135,879 A | * | 8/1992 | Richardson .................. 438/259 |
| 6,259,135 B1 | | 7/2001 | Hsu et al. |
| 6,642,573 B1 | * | 11/2003 | Halliyal et al. .............. 257/316 |
| 6,803,272 B1 | * | 10/2004 | Halliyal et al. .............. 438/240 |
| 6,870,215 B2 | | 3/2005 | Endoh et al. |
| 2002/0011612 A1 | | 1/2002 | Hieda |

(Continued)

FOREIGN PATENT DOCUMENTS

JP          05-291586          11/1993

(Continued)

OTHER PUBLICATIONS

Hieda, K. et al., "Effects of a New Trench-Isolated Transistor Using Sidewall Gates", IEEE Transactions on Electron Devices, vol. 36, No. 9, pp. 1615-1619, (Sep. 1989).

(Continued)

*Primary Examiner*—Richard A. Booth
(74) *Attorney, Agent, or Firm*—Finnegan, Henderson, Farabow, Garrett & Dunner, L.L.P.

(57) ABSTRACT

A semiconductor device comprises a semiconductor substrate, an electrically rewritable semiconductor memory cell provided on the semiconductor substrate, the memory cell comprising an island semiconductor portion provided on the surface of the semiconductor substrate or above the semiconductor substrate, a first insulating film provided on a top surface of the island semiconductor portion, a second insulating film provided on a side surface of the island semiconductor portion and being smaller in thickness than the first insulating film, and a charge storage layer provided on the side surface of the island semiconductor portion with the second insulating film interposed therebetween and on a side surface of the first insulating film, a third insulating film provided on the charge storage layer, and a control gate electrode provided on the third insulating film.

6 Claims, 27 Drawing Sheets

U.S. PATENT DOCUMENTS

2005/0121703 A1  6/2005  Hieda et al.

FOREIGN PATENT DOCUMENTS

| JP | 6-163921 | 6/1994 |
|---|---|---|
| JP | 7-45797 | 2/1995 |
| JP | 08-017948 | 1/1996 |

OTHER PUBLICATIONS

Notice of Reasons for Rejection issued by the Japanese Patent Office on Jun. 10, 2008, for Japanese Patent Application No. 2004-048170, and English-language translation thereof.

* cited by examiner

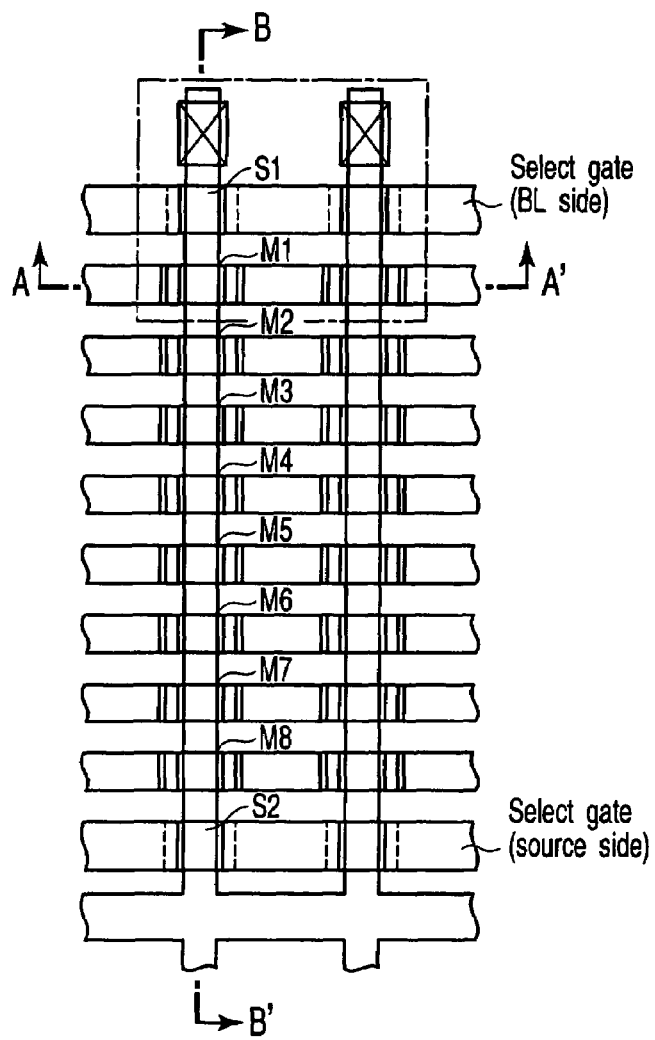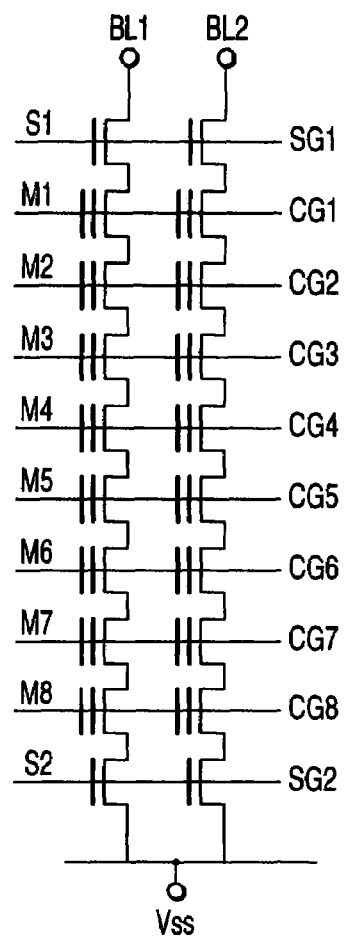
FIG.1A
FIG.1B

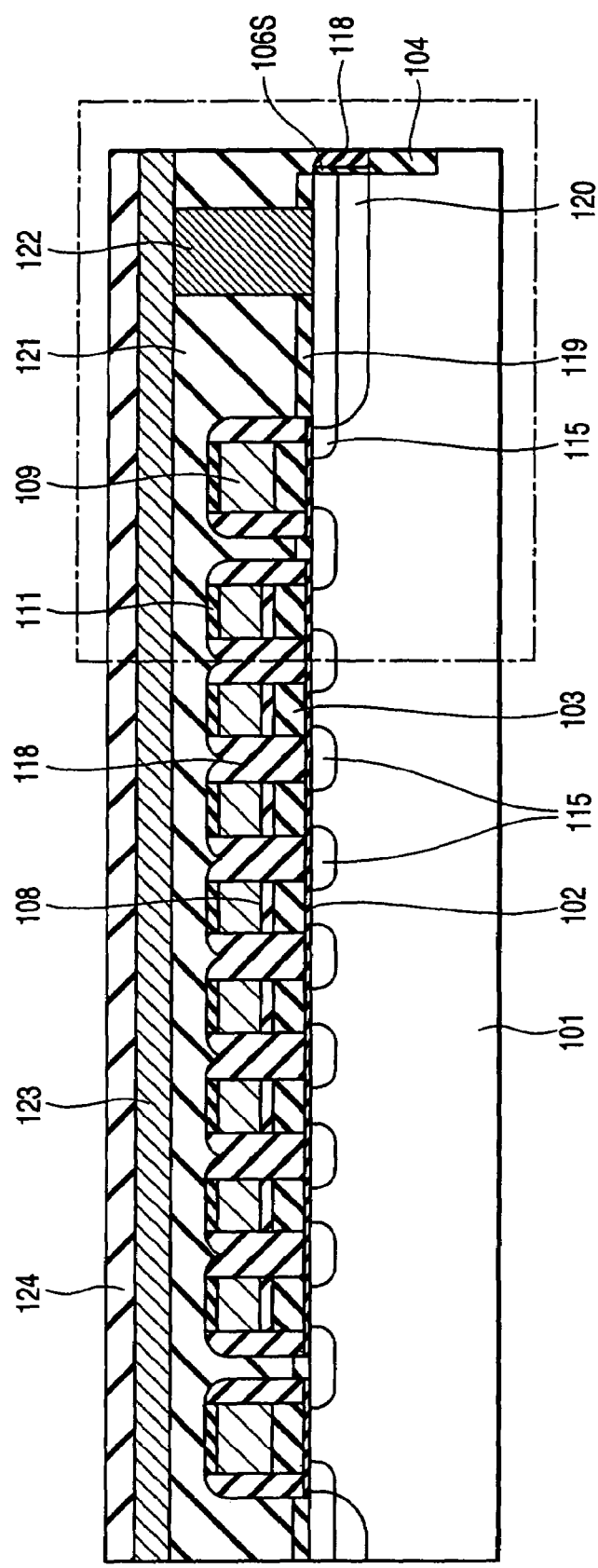
F I G. 2

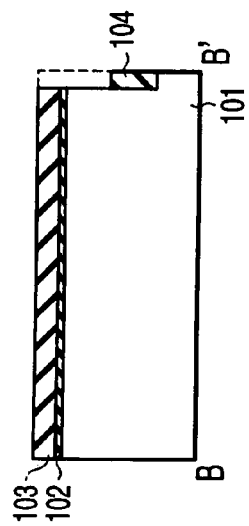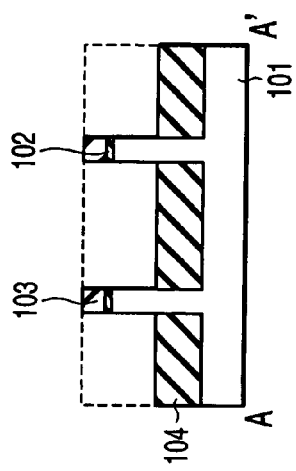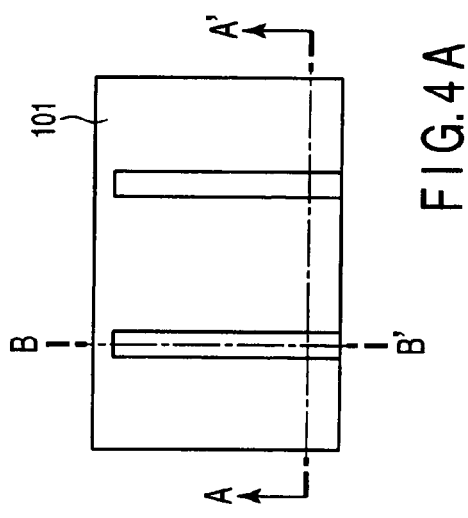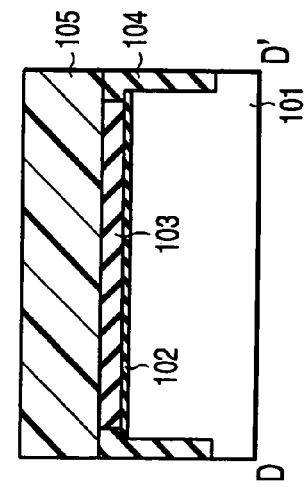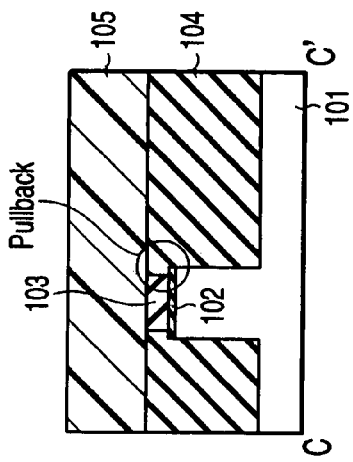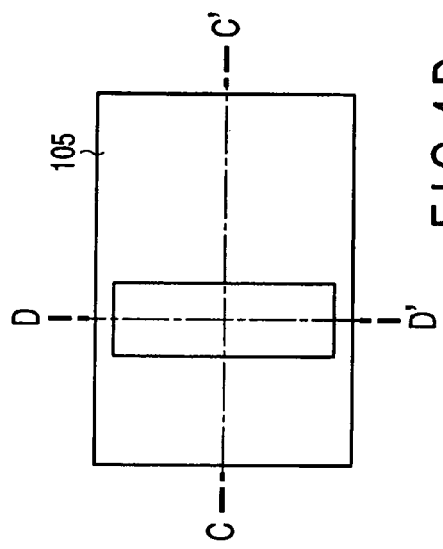

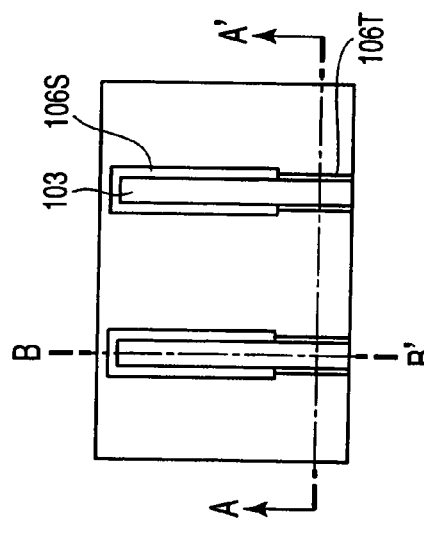
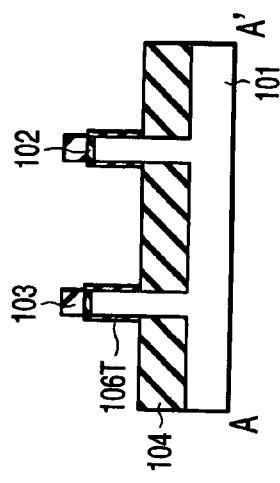
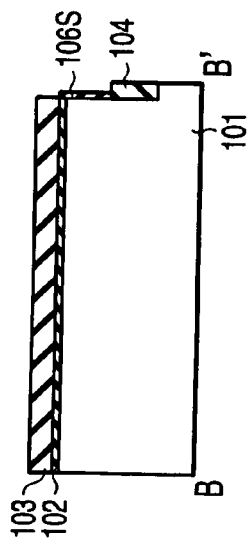
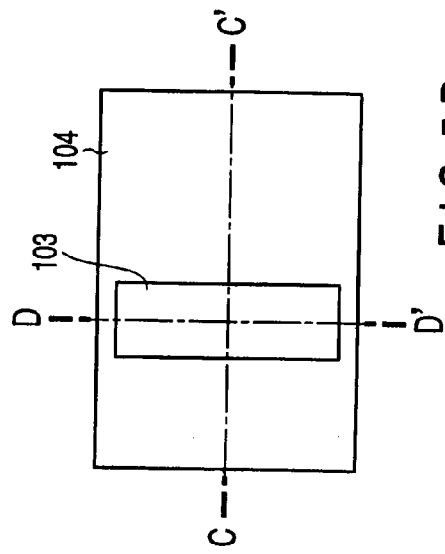
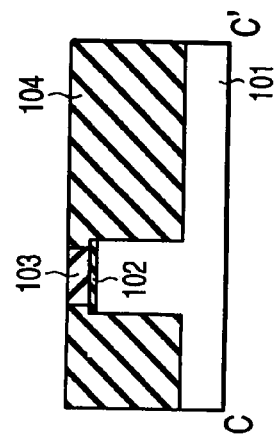
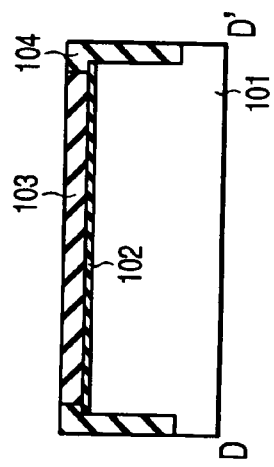

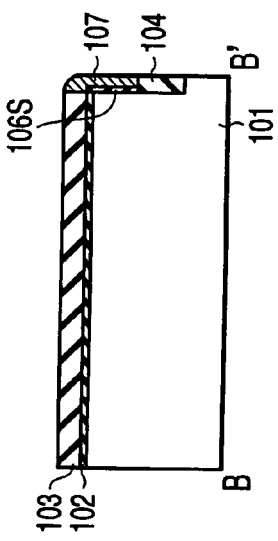
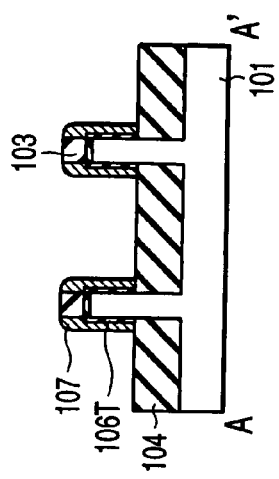
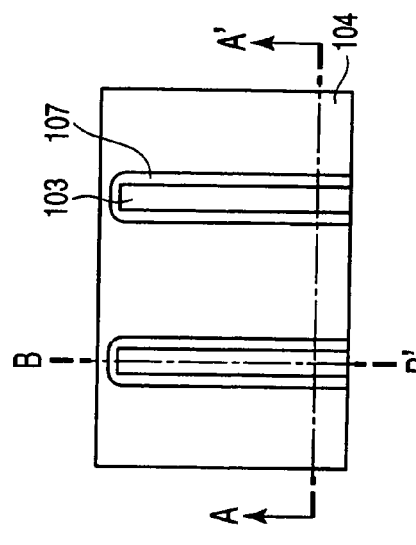
FIG.6A
FIG.6B
FIG.6C
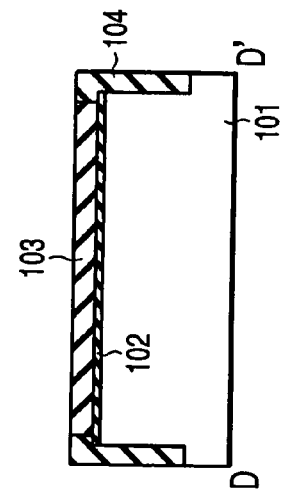
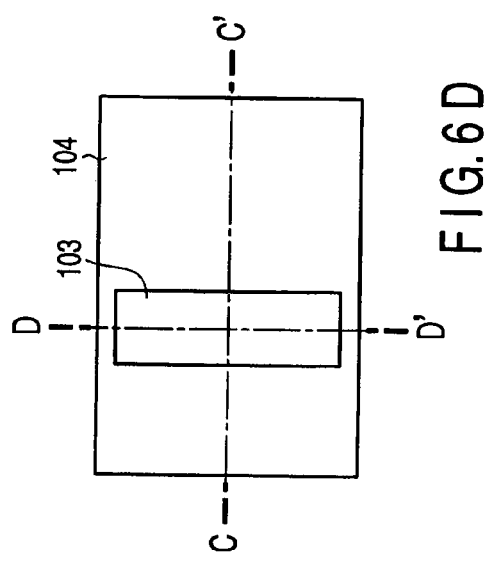
FIG.6D
FIG.6E
FIG.6F

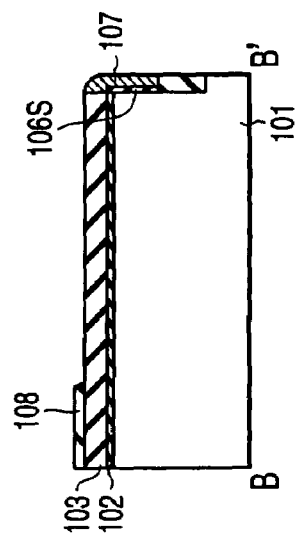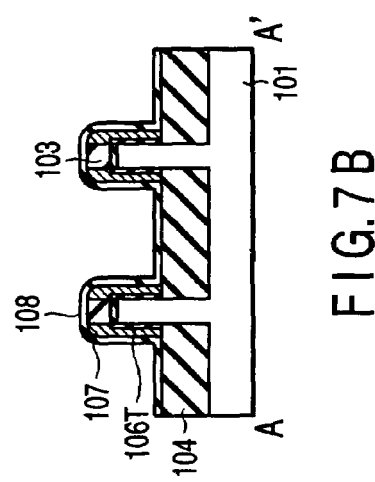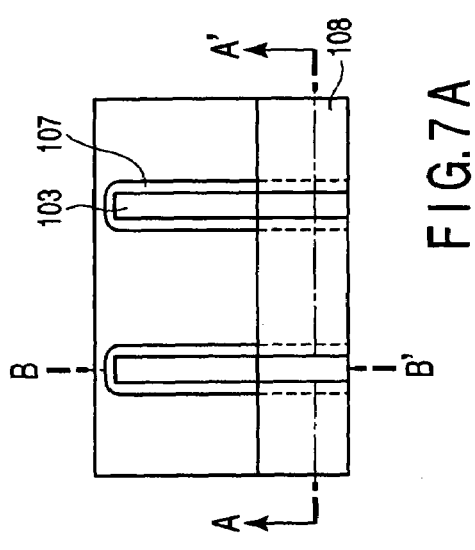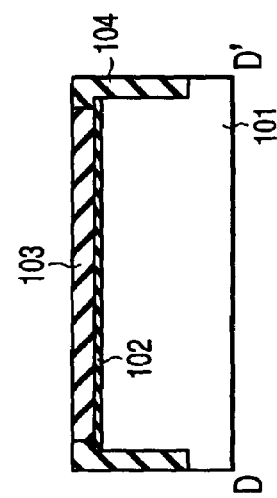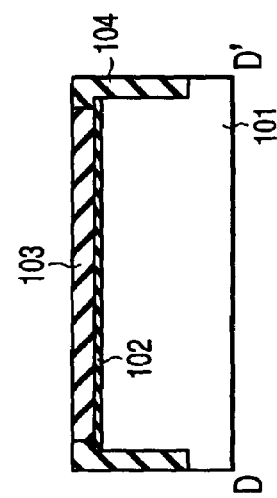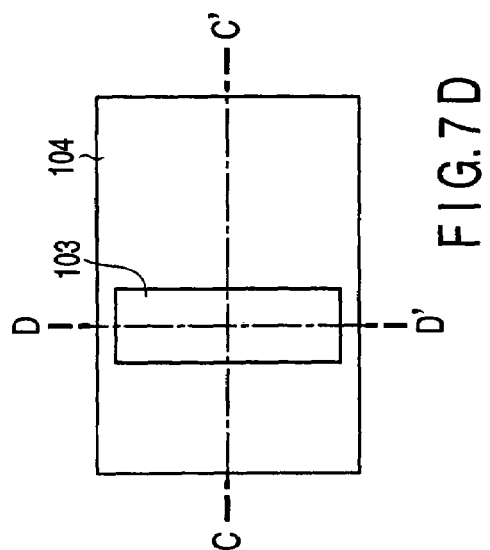

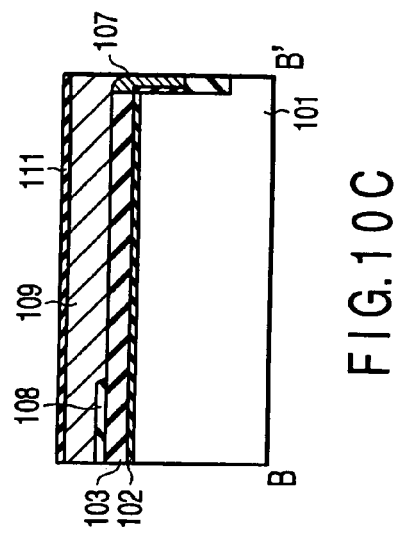
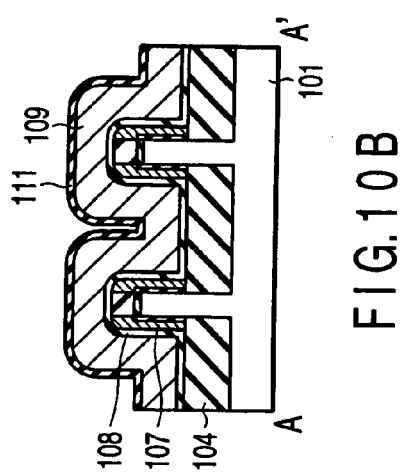
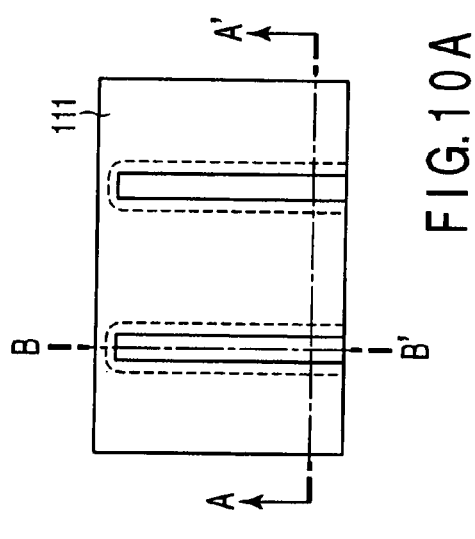
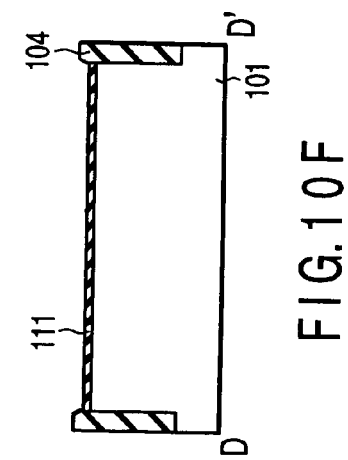
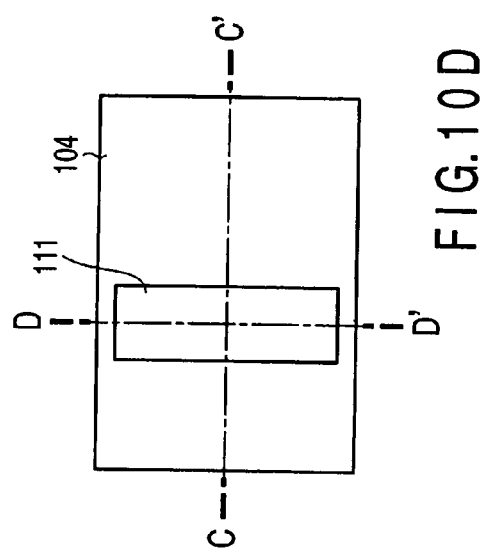

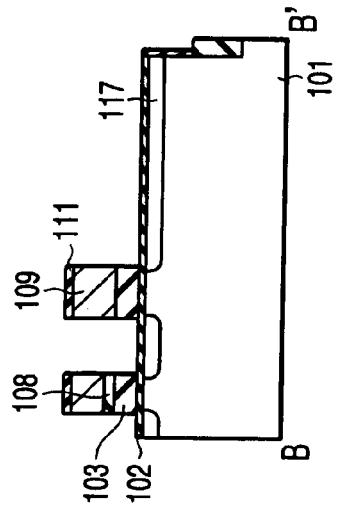
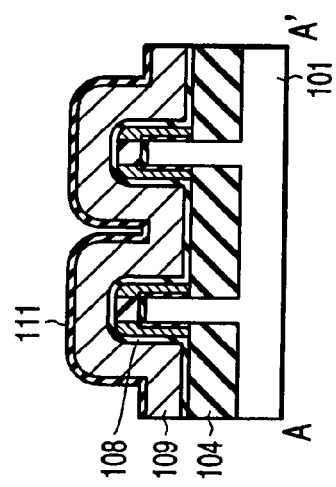
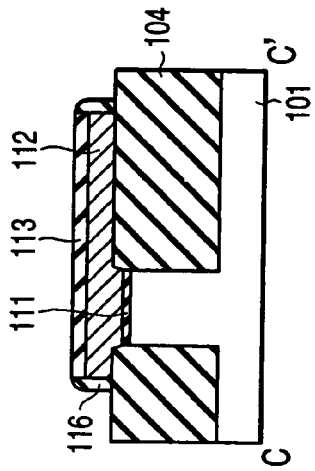
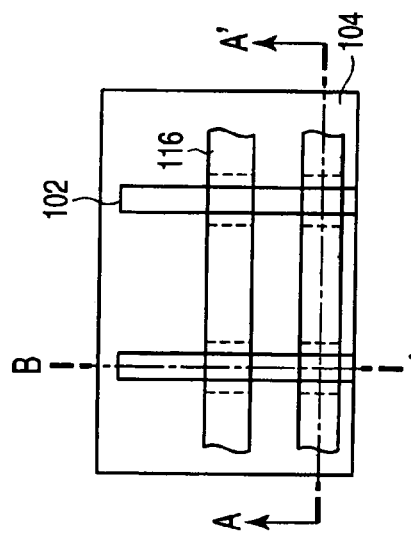
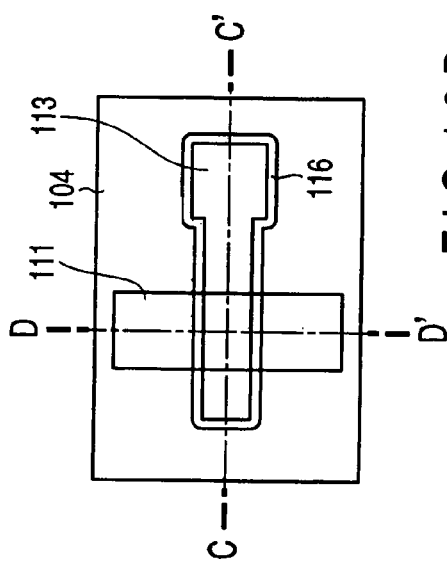

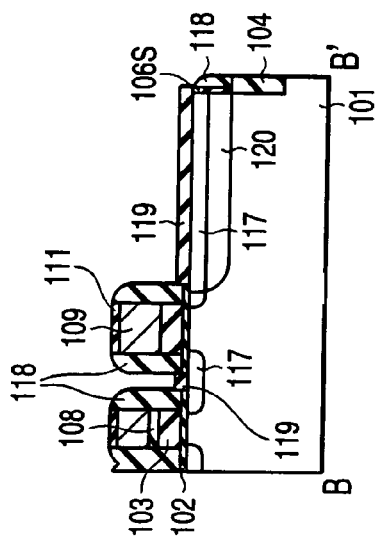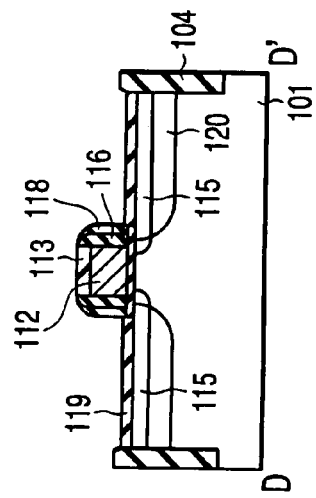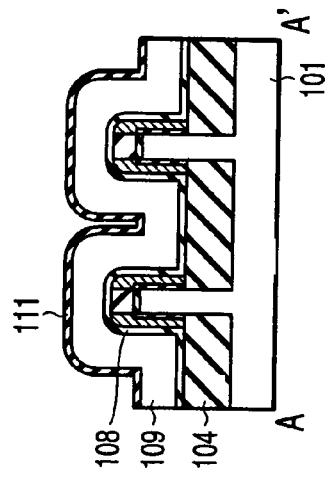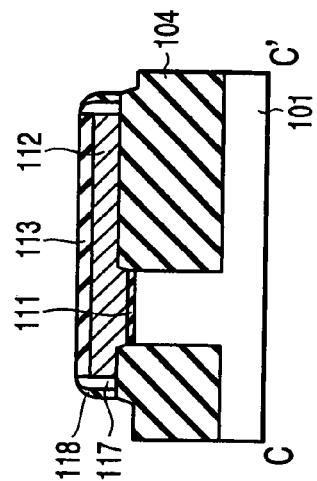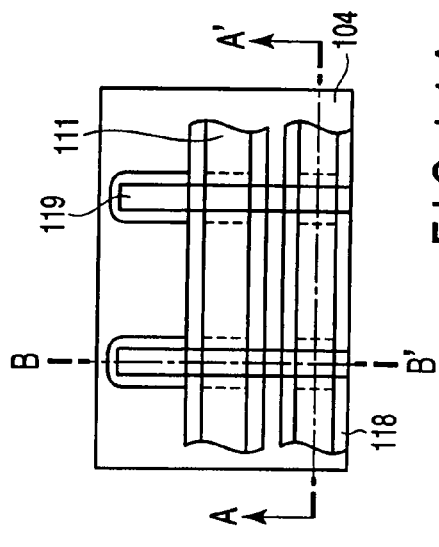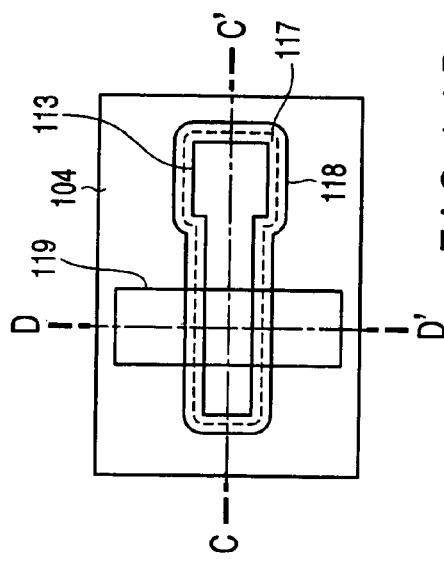

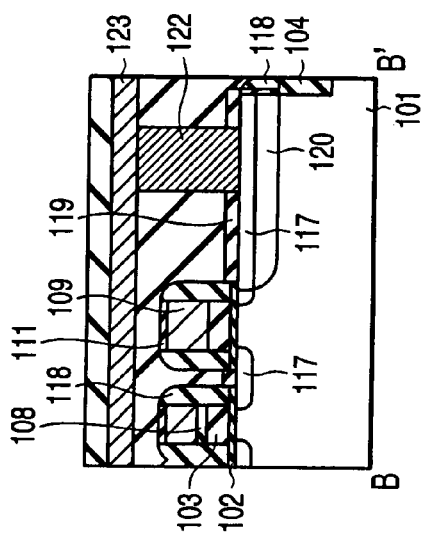
FIG.15A
FIG.15B
FIG.15C
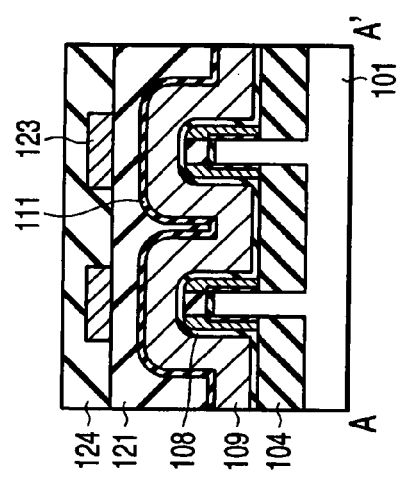
FIG.15D
FIG.15E
FIG.15F

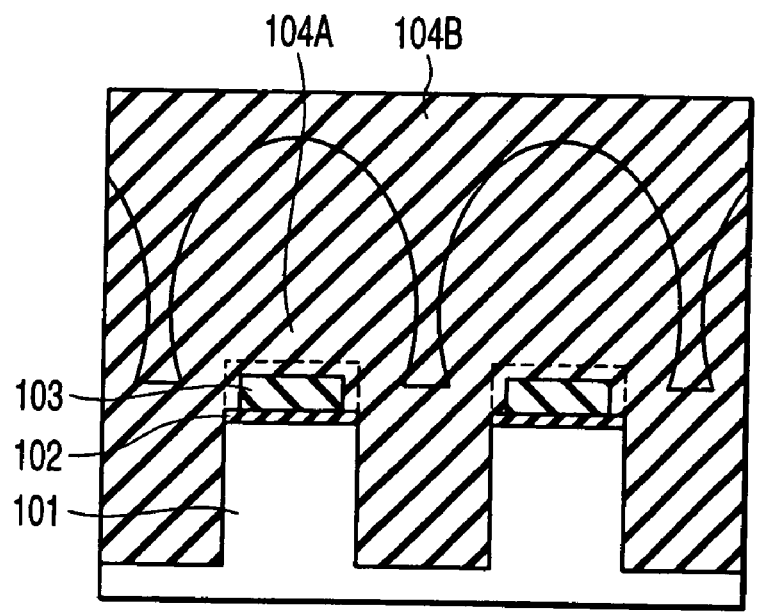
F I G. 22 A
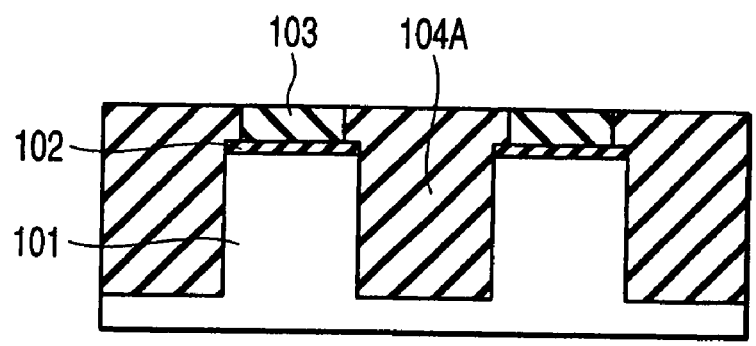
F I G. 22 B

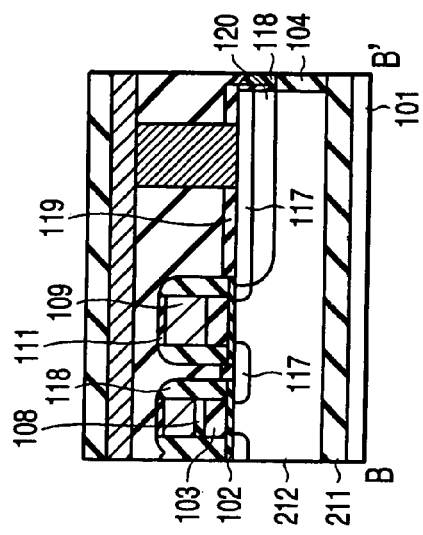
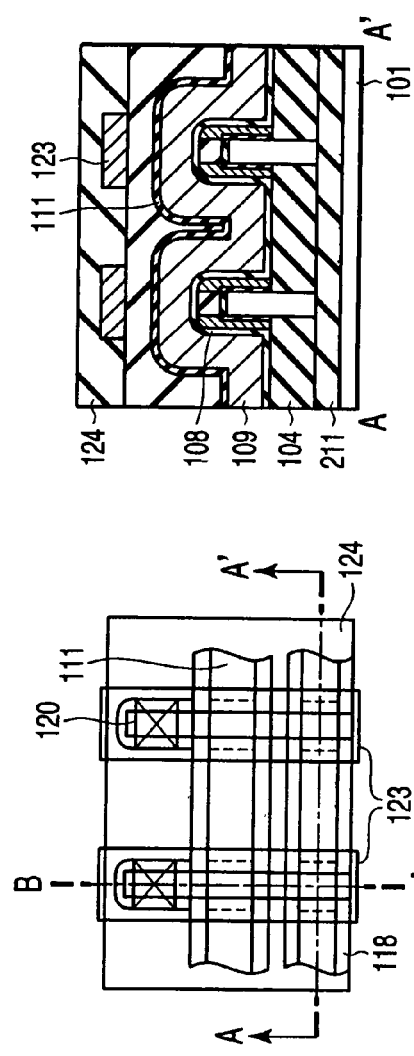
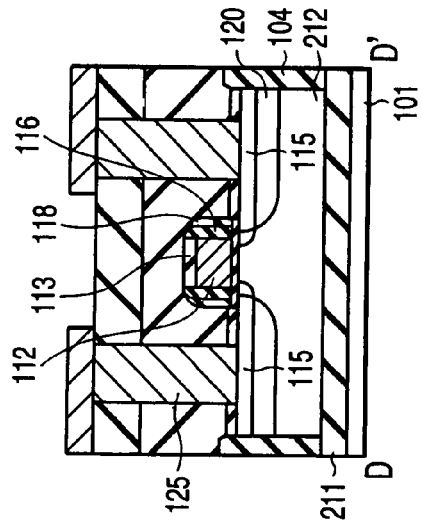
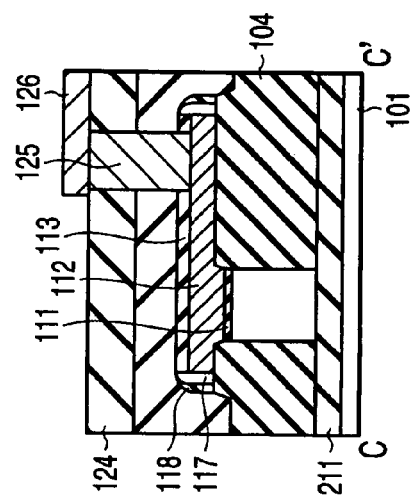
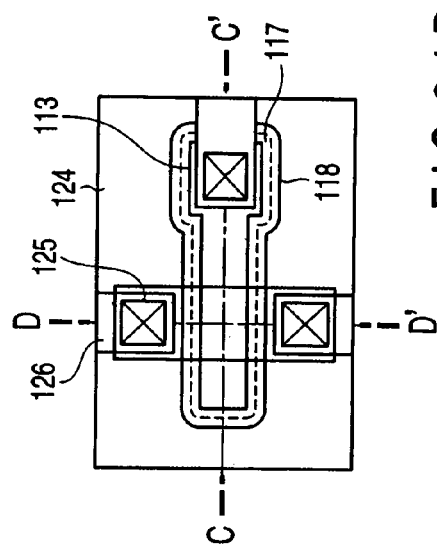
FIG. 24A  FIG. 24B  FIG. 24C
FIG. 24D  FIG. 24E  FIG. 24F

SEMICONDUCTOR DEVICE AND METHOD OF MANUFACTURE THEREOF

CROSS-REFERENCE TO RELATED APPLICATIONS

This is a divisional of application Ser. No. 11/064,453, filed Feb. 24, 2005 now U.S. Pat. No. 7,224,019, which is incorporated herein by reference.

This application is based upon and claims the benefit of priority from prior Japanese Patent Application No. 2004-048170, filed Feb. 24, 2004, the entire contents of which are incorporated herein by reference.

BACKGROUND OF THE INVENTION

1. Field of the Invention

The present invention relates to a semiconductor device including electrically rewritable semiconductor memory cells and a method of manufacture thereof.

2. Description of the Related Art

A nonvolatile semiconductor memory is one of the semiconductor memory devices. In recent years, the nonvolatile semiconductor devices are in increasing demand as data storage devices. As the typical electrically rewritable nonvolatile memories using floating-gate (FG) electrodes, NOR-type flash memory and NAND-type flash memory are known.

In order to increase the storage capacity of these flash memories, the dimensions of devices have been scaled down. However, shrinking the dimensions of devices have caused various problems, such as the increased aspect ratio of device structure, the effect on interference between adjacent FG electrodes, and the effect of variations in process on the injection of electrons into FG electrodes.

Since the NAND-type flash memory is advantageous to shrinking of the dimensions of devices, their storage capacity has been progressively increased. However, increasing the storage capacity has made problems of the short-channel effect (SCE) of transistors, the interaction (Yupin effect) due to coupling capacitance between adjacent FG electrodes, the reduced cell current by the miniaturization, and the difficulty in ensuring a sufficient coupling ratio between the control gate (CG) electrode-to-FG electrode capacitance (C2) and the FG electrode-to-substrate capacitance (C1). The coupling ratio is represented by C2/(C1+C2). Therefore, attempts are being made to contrive new memory cell structures.

In one of the conventional NAND-type flash memory cell structures, the coupling capacitance (C2) between FG and CG electrodes is made to increase by exposing the side of the FG electrode.

However, as the dimensions of devices shrink, the FG electrode becomes narrower in width and smaller in top surface area. As the result, it becomes difficult to ensure a sufficient coupling ratio.

There are variations in the process for exposing the side of the FG electrode. This produces variations in the width of the active area (AA). The variations in the AA width cause the coupling capacitance C1 between the FG electrode and the silicon substrate and the coupling capacitance C2 between the FG electrode and the CG electrode to vary. The variations of the coupling capacitances C1 and C2 result in a reduction in the yield of products.

With the conventional memory cell structure, in order to increase the cell current, it is required to increase the height of and the area of the side of the FG electrode. Increasing the height of the FG electrode leads to an increasing of the aspect ratio in the FG process. In terms of process, therefore, it is difficult to realize a high FG electrode. With the above method, therefore, it is difficult to increase the cell current.

In order to reduce the variations in the coupling capacitances C1 and C2 and to increase the cell current, a device structure has been proposed in which an FG electrode is formed on the side surface of a trench formed in the surface of a silicon substrate with a tunnel insulating film interposed therebetween (Jpn. Pat. Appln. KOKAI Publication No. 5-291586). With this device structure, however, limitations are encountered in increasing the coupling ratio. Moreover, since there are corners in the channel region, the writing (injecting electrons into the FG electrode) characteristics vary greatly according to their shape. Furthermore, in processing the CG and FG electrodes on the sidewall of the trench in the surface of the silicon substrate, there arises a problem in that the surface of the silicon substrate suffers etching.

As described above, the conventional flash memories have a problem that, with shrinking of device dimensions, it becomes more difficult to achieve a sufficient coupling ratio.

BRIEF SUMMARY OF THE INVENTION

According to an aspect of the present invention there is provided a semiconductor device comprising: a semiconductor substrate; an electrically rewritable semiconductor memory cell provided on the semiconductor substrate, the memory cell comprising an island semiconductor portion provided on the surface of the semiconductor substrate or above the semiconductor substrate, a first insulating film provided on a top surface of the island semiconductor portion, a second insulating film provided on a side surface of the island semiconductor portion and being smaller in thickness than the first insulating film, and a charge storage layer provided on the side surface of the island semiconductor portion with the second insulating film interposed therebetween and on a side surface of the first insulating film; a third insulating film provided on the charge storage layer; and a control gate electrode provided on the third insulating film.

According to another aspect of the present invention there is provided a method of manufacturing a semiconductor device comprising: forming an island semiconductor portion in a surface of a semiconductor substrate or above the semiconductor substrate by forming a trench in the surface of the semiconductor substrate; forming a first insulating film on a top surface of the island semiconductor portion; forming a second insulating film on a side surface of the island semiconductor portion; forming a first conductive film on a region including the island semiconductor portion, the first insulating film, and the second insulating film; forming a charge storage layer selectively on the side surface of the first insulating film and the side surface of the second insulating film by overall etching of the first conductive film, the charge storage layer comprising the first conductive film; forming a third insulating film on the charge storage layer; and forming a control gate electrode on the third insulating film.

BRIEF DESCRIPTION OF THE SEVERAL VIEWS OF DRAWING

FIGS. 1A and 1B are a plan view and an equivalent circuit diagram, respectively, of a NAND flash memory according to the first embodiment of the present invention;

FIG. 2 is a part of a cross sectional view taken along line B-B' of FIG. 1A;

FIGS. 4A-4F are plan views and cross sectional views of the NAND flash memory of the first embodiment in the process of manufacture thereof;

FIGS. 5A-5F are plan views and cross sectional views of the NAND flash memory of the first embodiment subsequent to the process steps of FIGS. 4A-4F in the process of manufacture thereof;

FIGS. 6A-6F are plan views and cross sectional views of the NAND flash memory of the first embodiment subsequent to the process steps of FIGS. 5A-5F in the process of manufacture thereof;

FIGS. 7A-7F are plan views and cross sectional views of the NAND flash memory of the first embodiment subsequent to the process steps of FIGS. 6A-6F in the process of manufacture thereof;

FIGS. 10A-10F are plan views and cross sectional views of the NAND flash memory of the first embodiment subsequent to the process steps of FIGS. 9A-9F in the process of manufacture thereof;

FIGS. 13A-13F are plan views and cross sectional views of the NAND flash memory of the first embodiment subsequent to the process steps of FIGS. 12A-12F in the process of manufacture thereof;

FIGS. 14A-14F are plan views and cross sectional views of the NAND flash memory of the first embodiment subsequent to the process steps of FIGS. 13A-13F in the process of manufacture thereof;

FIGS. 15A-15F are plan views and cross sectional views of the NAND flash memory of the first embodiment subsequent to the process steps of FIGS. 14A-14F in the process of manufacture thereof;

FIGS. 22A and 22B are cross sectional views for use in explanation of an example of a hybrid STI filling technique;

FIGS. 24A-24F are plan and cross sectional views of the NAND flash memory under manufacturing according to the second embodiment of the present invention;

DETAILED DESCRIPTION OF THE INVENTION

The embodiments of the invention will be described hereinafter with reference to the accompanying drawings.

First Embodiment

FIGS. 1A and 1B show a NAND flash memory according to the first embodiment of the present invention. More specifically, FIG. 1A shows, in plan view, memory cells of the NAND flash memory and FIG. 1B shows equivalent circuits of the memory cells of FIG. 1A.

In FIGS. 1A and 1B, M1 to M8 denote nonvolatile memory cell portions, S1 and S2 denote select transistor portions, CG1 to CG8 denote control gates, SG1 and SG2 denote select gates, BL1 and BL2 denote bit lines, and Vss denotes power supply voltage (ground).

Figure 3A:
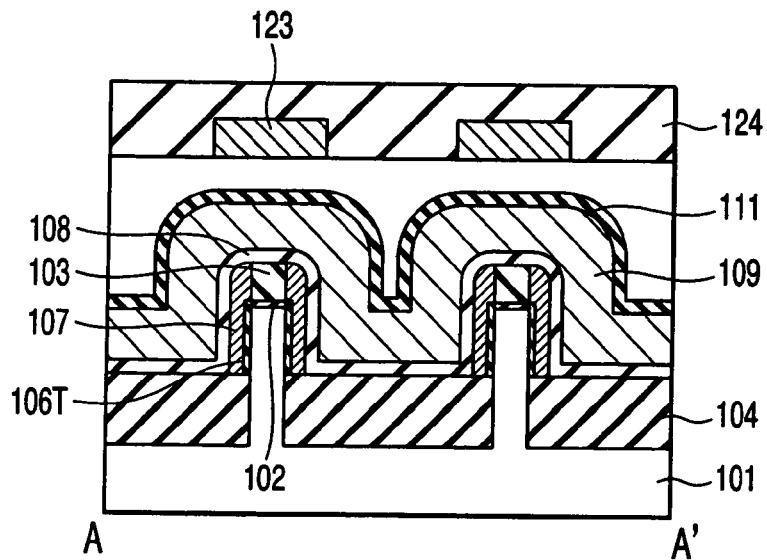
FIGS. 3A and 3B are a cross sectional view taken along line A-A' of FIG. 1A and an enlarged view of a part of the cross sectional view of FIG. 2.
Figure 3B:
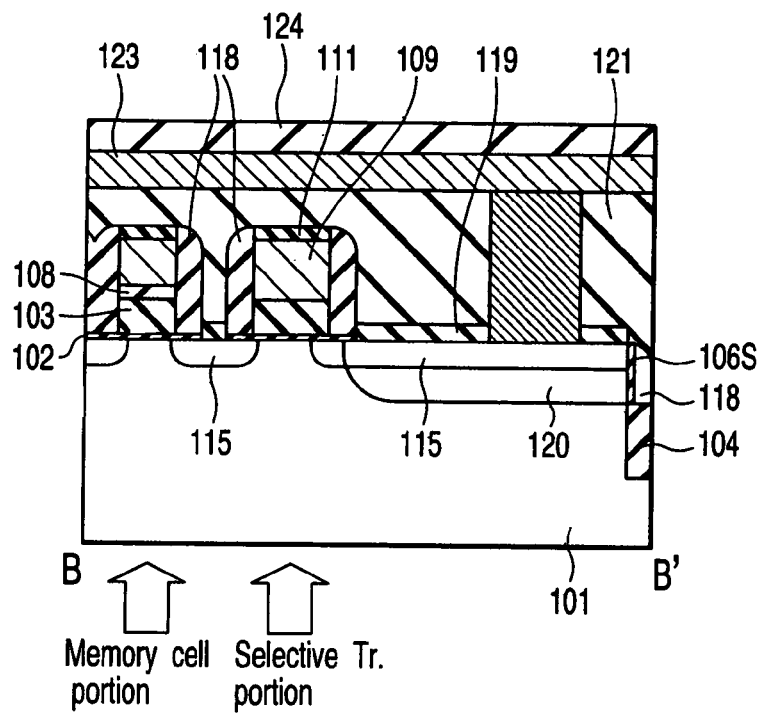
Figure 8C:
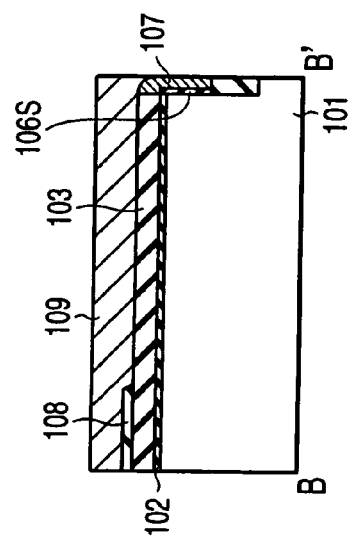
FIGS. 8A-8F are plan views and cross sectional views of the NAND flash memory of the first embodiment subsequent to the process steps of FIGS. 7A-7F in the process of manufacture thereof.
Figure 8F:
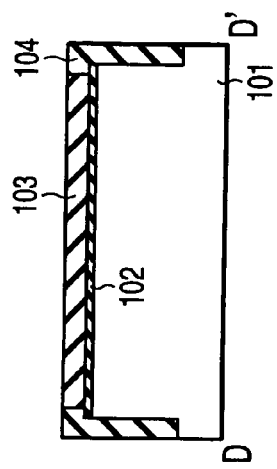
Figure 8B:
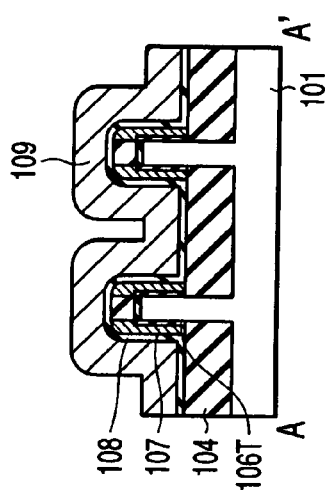
Figure 8E:
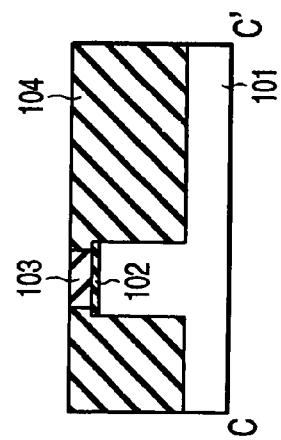
Figure 8A:
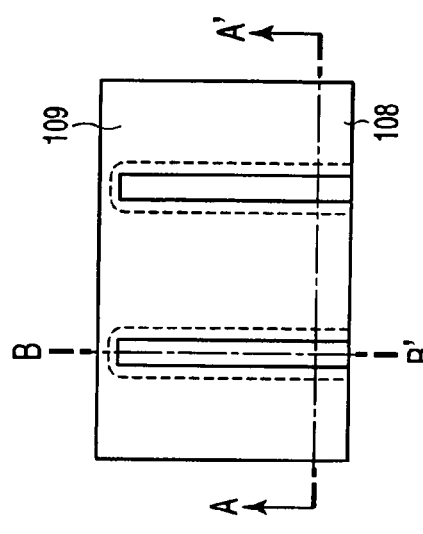
Figure 8D:
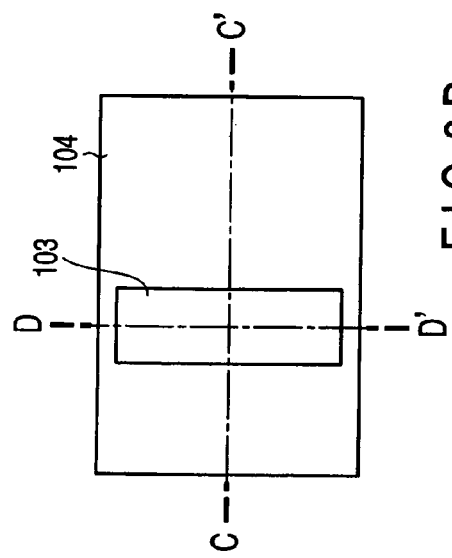
Figure 9A:
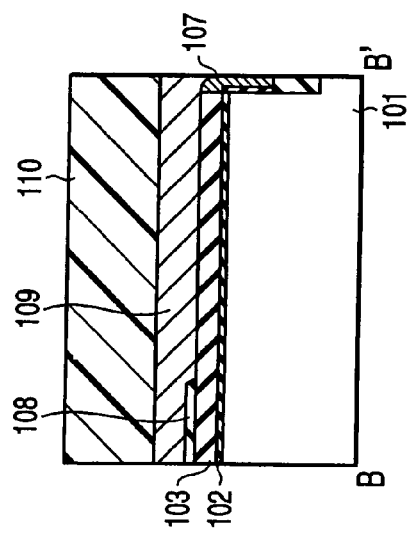
FIGS. 9A-9F are plan views and cross sectional views of the NAND flash memory of the first embodiment subsequent to the process steps of FIGS. 8A-8F in the process of manufacture thereof.
Figure 9D:
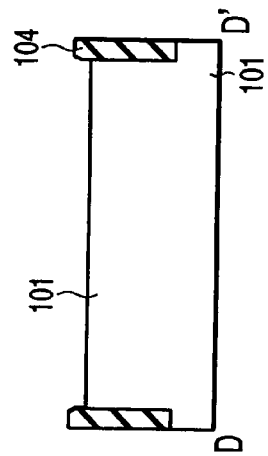
Figure 9B:
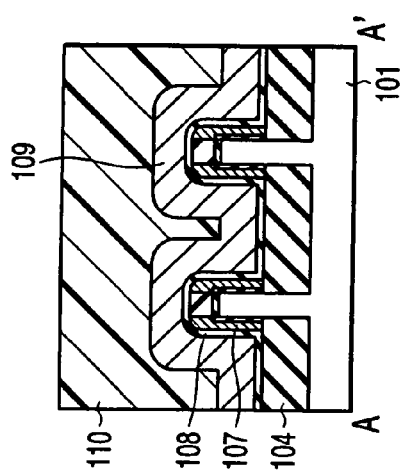
Figure 9E:
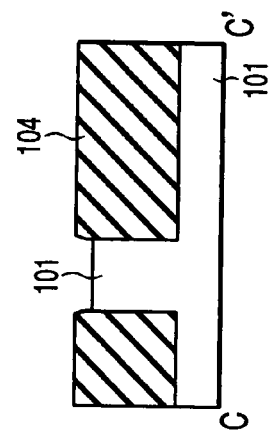
Figure 9C:
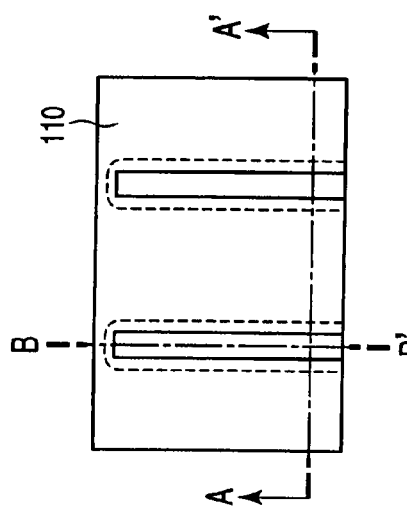
Figure 9F:
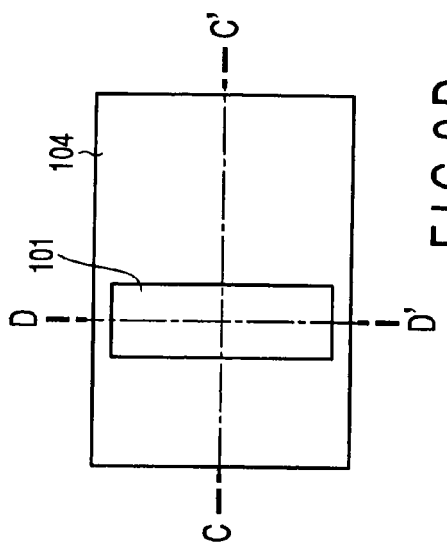
Figure 11C:
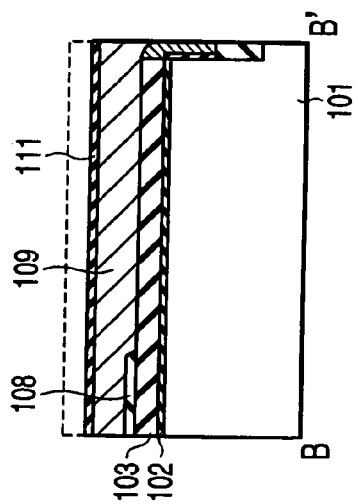
FIGS. 11A-11F are plan views and cross sectional views of the NAND flash memory of the first embodiment subsequent to the process steps of FIGS. 10A-10F in the process of manufacture thereof.
Figure 11F:
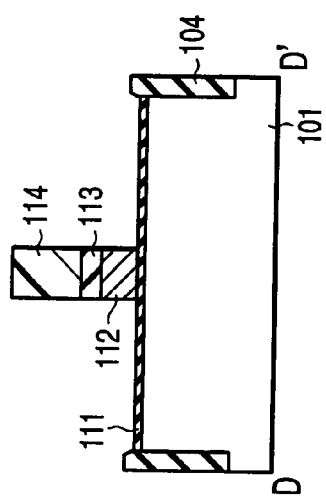
Figure 11B:
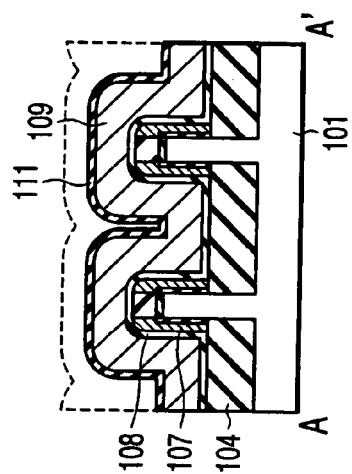
Figure 11E:
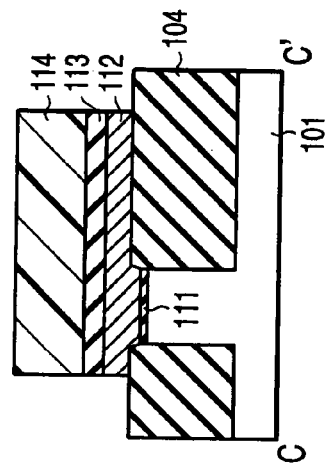
Figure 11A:
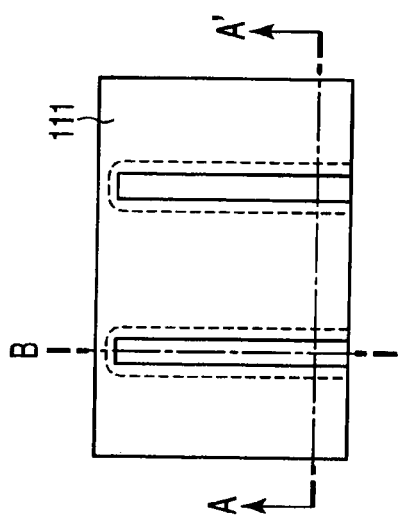
Figure 11D:
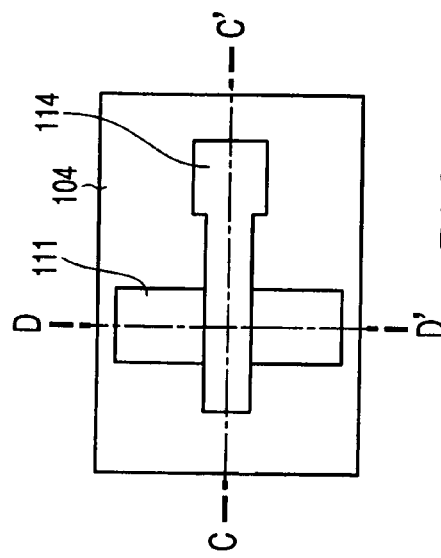
Figure 12A:
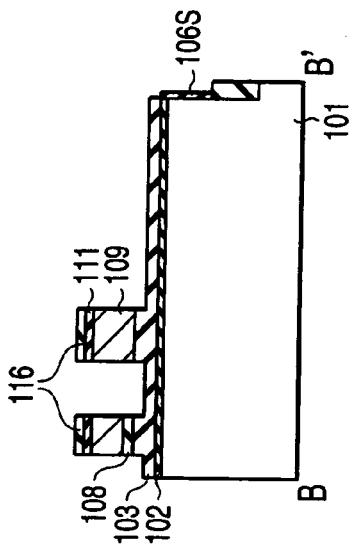
FIGS. 12A-12F are plan views and cross sectional views of the NAND flash memory of the first embodiment subsequent to the process steps of FIGS. 11A-11F in the process of manufacture thereof.
Figure 12B:
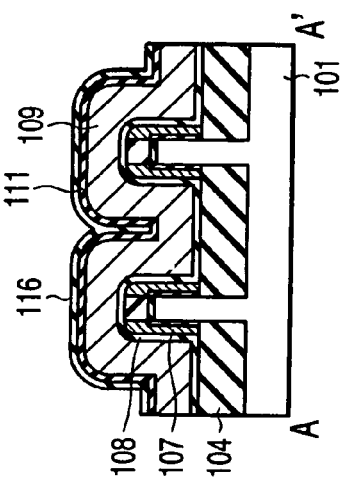
Figure 12C:
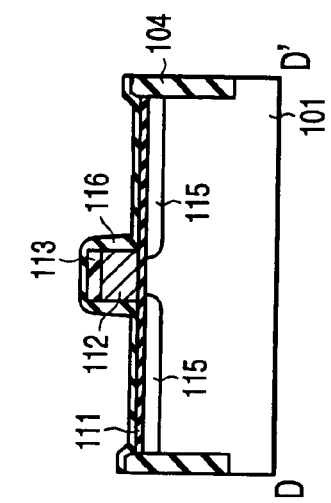
Figure 12D:
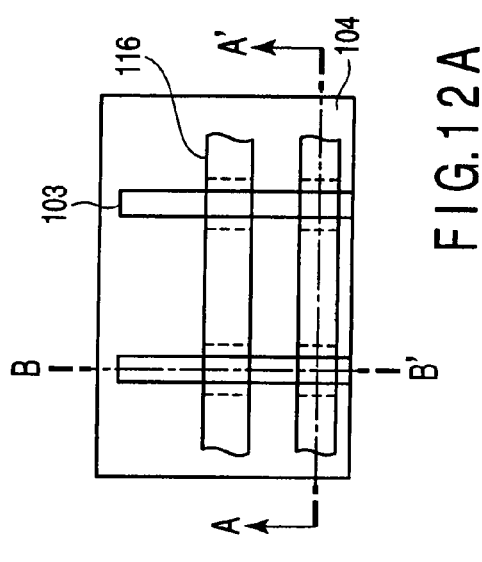
Figure 12E:
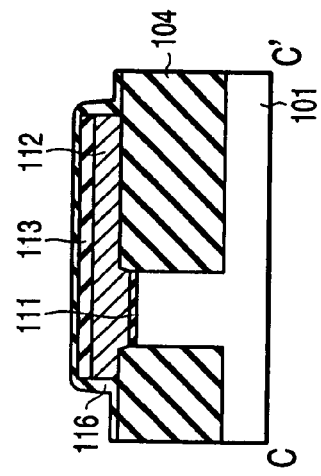
Figure 12F:
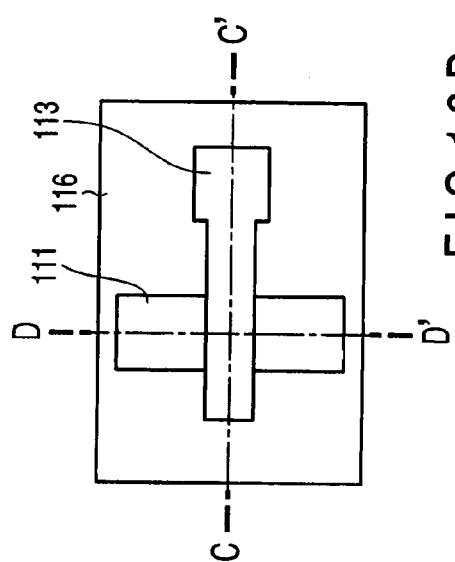

FIG. 2 is a cross sectional view taken along line B-B' of FIG. 1A. FIG. 3A is a cross sectional view taken along line A-A' of FIG. 1A. FIG. 3B is an enlarged cross sectional view of a part of FIG. 2. Note that wiring layers up to the word lines and the bit lines are illustrated, but contacts, wiring layers higher than metal lines and the passivation layer are omitted from the drawings.

In the diagrams, 101 denotes a P-type silicon substrate, 102 denotes a silicon oxide film, 103 denotes a silicon nitride film which protects the substrate surface and prevents the formation of corners in the substrate surface, 104 denotes an insulating film (isolation insulating film) which fills an isolation trench (STI), 106S denotes the gate insulating film of a select transistor, 106T denotes a tunnel insulating film, 107 denotes a floating gate (FG) electrode formed on the side surface of a convex (projecting) fin portion formed on the silicon substrate with the tunnel insulating film interposed therebetween, 108 denotes an interpoly insulating film (high-k film) formed between FG and CG electrodes, 109 denotes a control gate (CG) (word line), 111 denotes a gate insulating film of a control circuit section, 118 denotes a sidewall insulating film of a gate electrode, 119 denotes a silicon oxide film, 115 and 120 denote source/drain diffusion layers, 121 denotes an interlayer insulating film, 122 denotes a buried layer (plug) to bit-line contact, 123 denotes a bit line, and 124 denotes an interlayer insulating film.

The convex fin portion comprises an island silicon portion which is narrow in width and provided on the surface of the silicon substrate 101 and island insulating films (a silicon oxide film 102 and a silicon nitride film 103) provided on the top surface of the island silicon portion. The island silicon portion is formed by etching the surface of the silicon substrate 101 when an isolation trench is formed.

In the present embodiment, as the select transistors (S1, S2), fin FETs are used. As shown in FIG. 3A, the FG electrode 107 of the storage element (memory cell) section is formed only on both side surfaces (first and second side surfaces) of the fin portion. The first side surface is opposed to the second side surface.

In the memory cell section, the CG electrode 109 is formed above the FG electrode 107 with the interpoly insulating film 108 interposed therebetween over the region including the region between the fin portions. In the select transistor section, the CG electrode 109 is formed with no interpoly insulating film interposed.

The top surface of the fin portion is flat. The silicon nitride film 103, which has a sufficiently large thickness in comparison with the tunnel insulating film, is formed above the top surface of the fin portion with the silicon oxide film 102 interposed therebetween. For this reason, the top surface of the fin portion is prevented from being overetched by the etching process to form the gate electrode.

As will be described later, the FG-to-CG capacitance (C2) can be increased without increasing the memory cell area.

The tunnel insulating film 106T is formed only on the side surfaces of the fin portion. The FG electrode 107 is formed so as not to cover the top corners of the fin portion. Therefore, no corner is produced in the channel portion, thus preventing the write characteristics from greatly varying according to the corner shape.

The side surface of the fin portion forms a channel region in which a cell current flows. The cell area will not increase even if the channel region is enlarged. That is, the cell current can be increased without increasing the cell area.

A double-gate transistor structure using the island fin portion which is very narrow in width is formed, thus allowing the channel region of the flash memory cell to be completely depleted when the flash memory cell is in operation. Thus, the SCE is suppressed even if the channel length of the transistor is made short.

As the interpoly insulating film 108, a high-k film is used, thus the FG-to-CG capacitance C2 is increased.

A method of manufacturing the NAND flash memory will be described next with reference to FIGS. 4A to 23B. In each set of six diagrams identified by A to F, the first diagram (A) is a plan view of a part of FIG. 1A, the second diagram (B) is a cross sectional view taken along line A-A' of the first diagram, and the third diagram (C) is a cross sectional view taken along line B-B' of the first diagram. The fourth diagram (D) is a plan view of the control circuit section formed in the same chip, the fifth diagram (E) is a cross sectional view taken along line C-C' of the fourth diagram, and the sixth diagram (F) is a cross sectional view taken along line D-D' of the fourth diagram.

First, as shown in FIGS. 4A to 4F, a P-type silicon substrate 101 is prepared. Then, using lithographic, ion implantation and annealing processes, P and N wells (not shown) are formed in selected desired areas in the surface of the silicon substrate 101.

Next, a silicon oxide film 102 with a thickness of about 4 nm is formed on the surface of the silicon substrate 101. After that, using lithographic and ion implantation processes, an impurity layer (not shown) for preventing field inversion on the isolation region for the transistor. Then, the activation of the implanted impurities is carried out by annealing.

Next, a silicon nitride film ($Si_3N_4$ film) 103 is formed over the entire surface by LPCVD process. The thickness of the silicon nitride film 103 is for example about 70 nm. Then, the silicon nitride film 103, the silicon oxide film 102 and the silicon substrate 101 are etched in sequence by using lithography process and RIE (Reactive Ion Etching) process to form a pattern of Si projections (fin portions).

The fin portions can also be formed in accordance with another method; for example, a pattern transfer method using what is referred to as a sidewall leaving process. The use of this method allows fin portions having a width below limitations in lithography to be realized. This method of forming the fin portions will be described below with reference to FIGS. 16A to 21B.

Figure 16A:
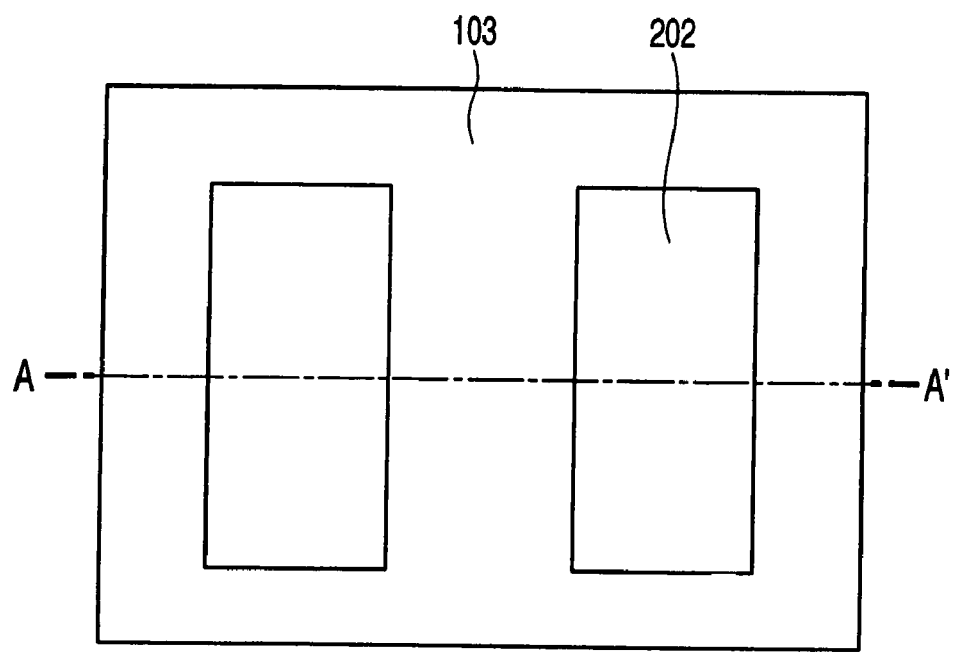
FIGS. 16A and 16B are a plan view and a cross sectional view, respectively, for use in explanation of a method of forming a fin portion having a width below the limitation in lithography.
Figure 16B:
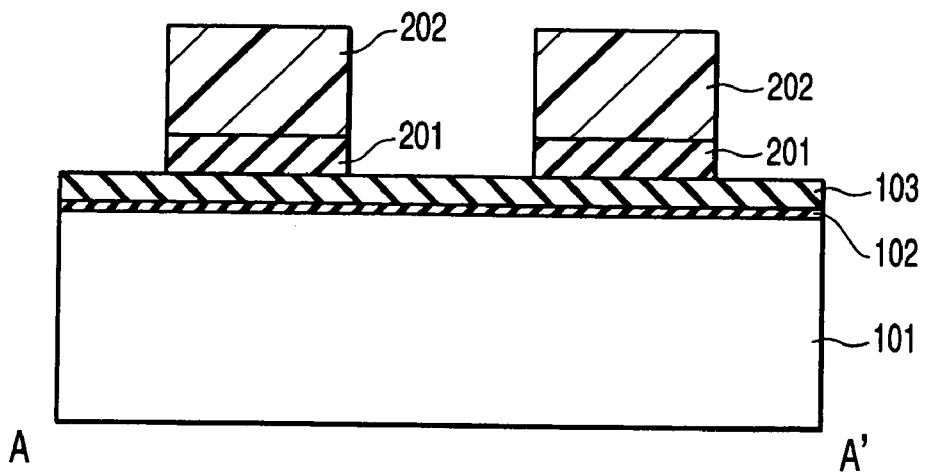

First, as shown in FIGS. 16A and 16B, an oxide film 201 is deposited to a thickness of about 150 nm on the silicon oxide film 102 and the silicon nitride film 103. Then, a resist film 202 is formed on the oxide film 201 using ordinary lithography process. Next, using the resist film 202 as a mask, the oxide film 201 is etched by dry etching (for example, RIE), and the oxide film 201 including a desired pattern is formed. Here, the width of the resist film 202 is for example about 110 nm. The resist film 202 of such a width can be formed readily by using the ordinary lithography process.

Figure 17A:
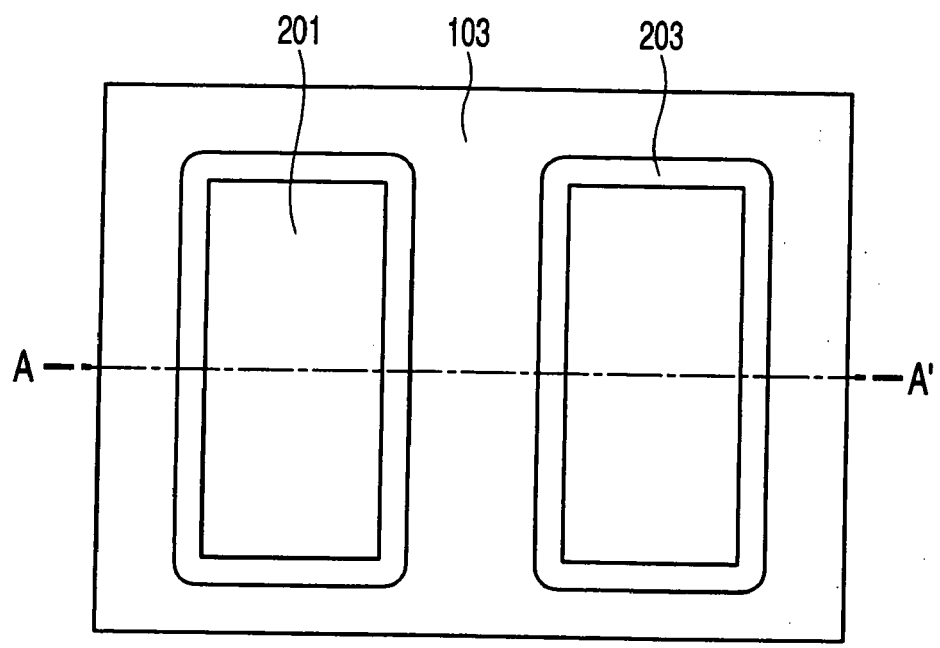
FIGS. 17A and 17B are a plan view and a cross sectional view, respectively, illustrating steps subsequent to the process steps of FIGS. 16A and 16B.
Figure 17B:
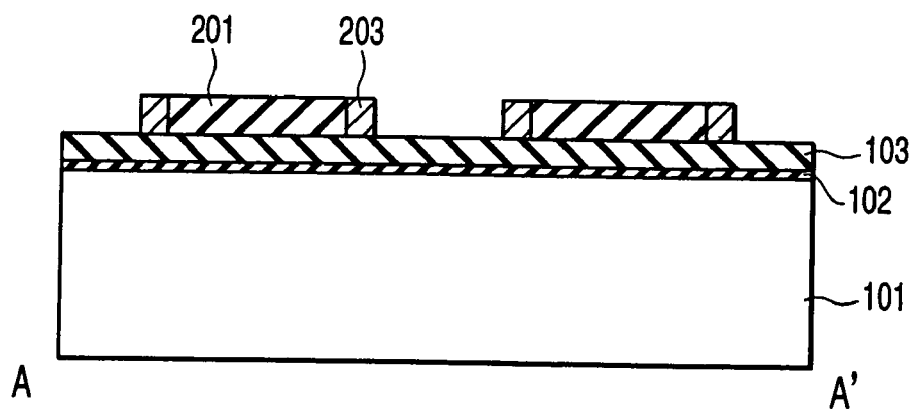

Next, as shown in FIGS. 17A and 17B, the resist film 202 is removed, thereafter, a polycrystalline silicon film 203 with a thickness of about 15 nm is formed over the entire surface and then etched by RIE process to thereby leave the polycrystalline silicon film 203 on the sidewall of the oxide film 201. The thickness of the polycrystalline silicon film 203 (15 nm in the present embodiment) determines the width of the fin portion (15 nm in the present embodiment) to be formed by a subsequent step.

Figure 18A:
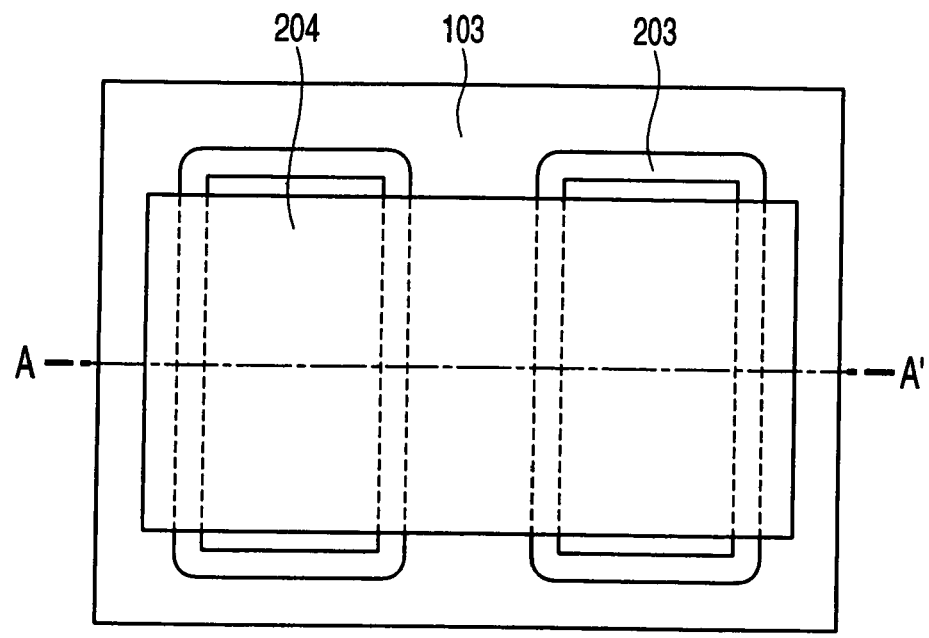
FIGS. 18A and 18B are a plan view and a cross sectional view, respectively, illustrating steps subsequent to the process steps of FIGS. 17A and 17B.
Figure 18B:
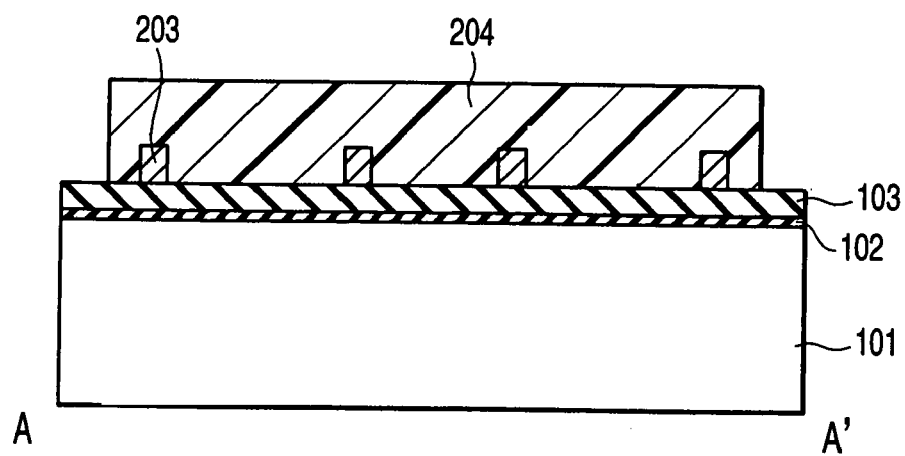

Next, as shown in FIGS. 18A and 18B, the oxide film 201 is removed by wet etching process using an HF-based solution, thereafter, by using standard lithography process, a resist film 204 is formed on areas where portions of the polycrystalline silicon film 203 which are to be protected are included.

Figure 19A:
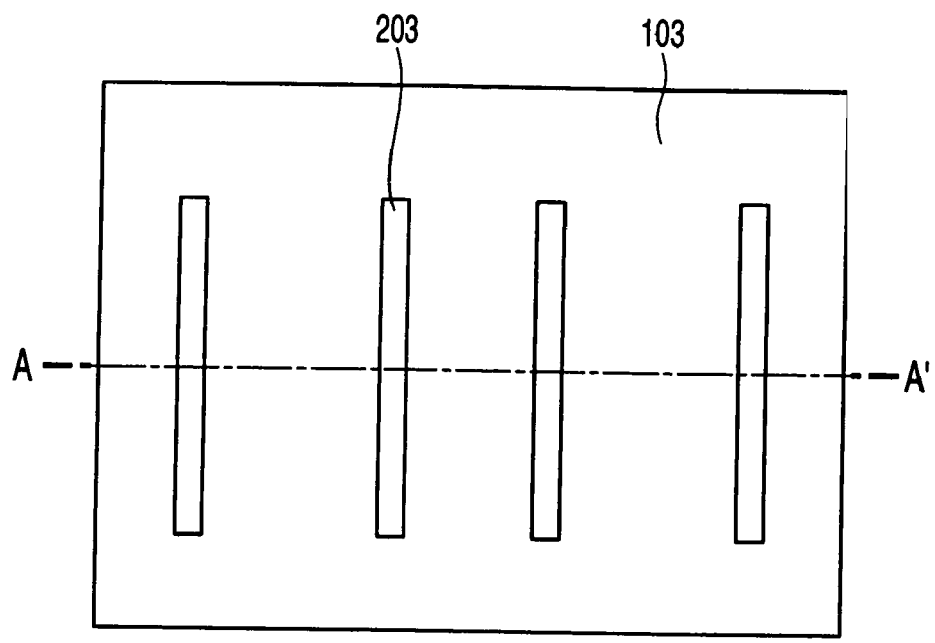
FIGS. 19A and 19B are a plan view and a cross sectional view, respectively, illustrating steps subsequent to the process steps of FIGS. 18A and 18B.
Figure 19B:
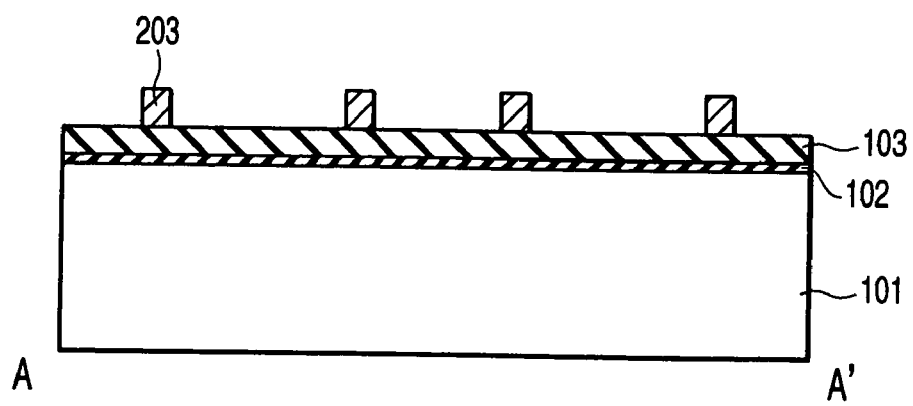

Next, as shown in FIGS. 19A and 19B, using the resist film 204 as a mask, the polycrystalline silicon film 203 is etched by dry etching process to remove its unnecessary portions. In this way, a polycrystalline silicon film pattern comprising a plurality of isolated polycrystalline silicon film 203 is formed.

Figure 20A:
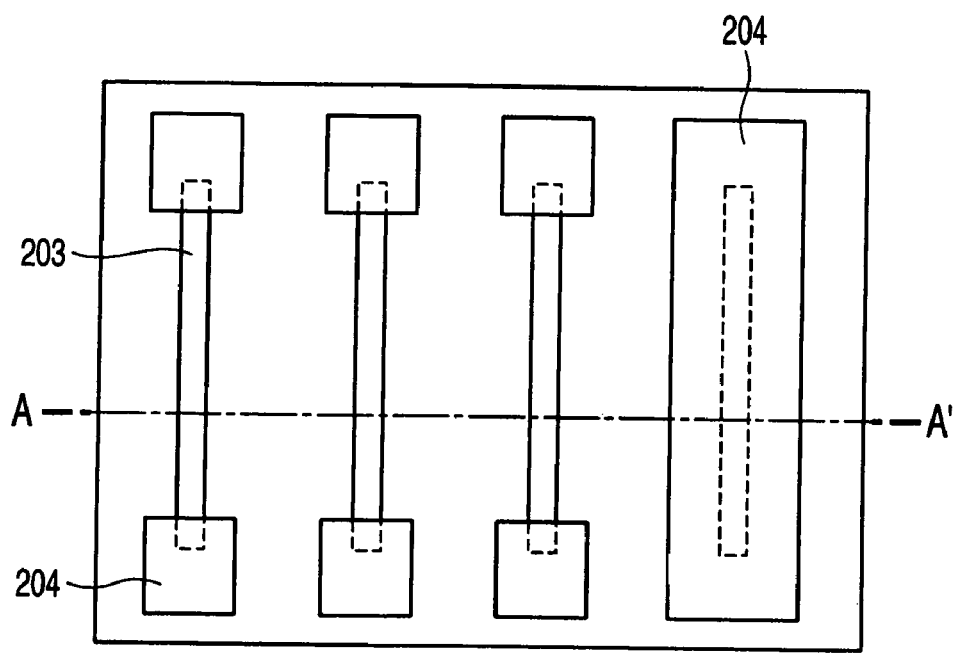
FIGS. 20A and 20B are a plan view and a cross sectional view, respectively, illustrating steps subsequent to the process steps of FIGS. 19A and 19B.
Figure 20B:
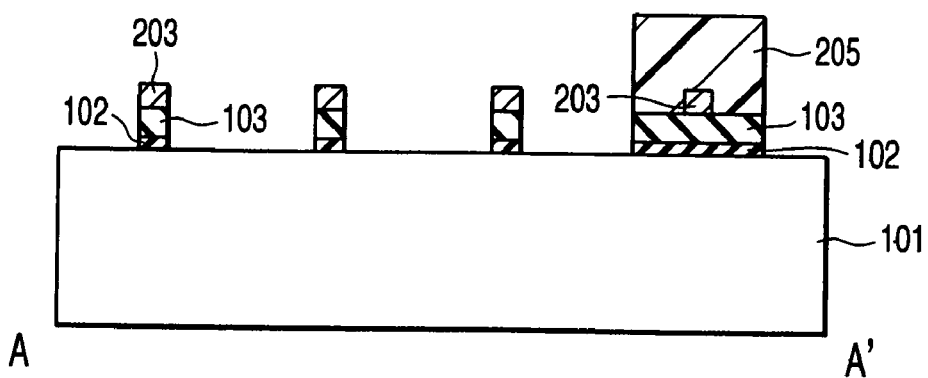

Next, as shown in FIGS. 20A and 20B, using ordinary lithography process, a resist film 205 is formed on the area where includes the polycrystalline silicon film 203 on the area to be protected, thereafter, using the polycrystalline silicon film 203 and the resist film 205 as a mask, the silicon nitride film 103 and the silicon oxide film 102 are selectively etched by RIE process.

Figure 21A:
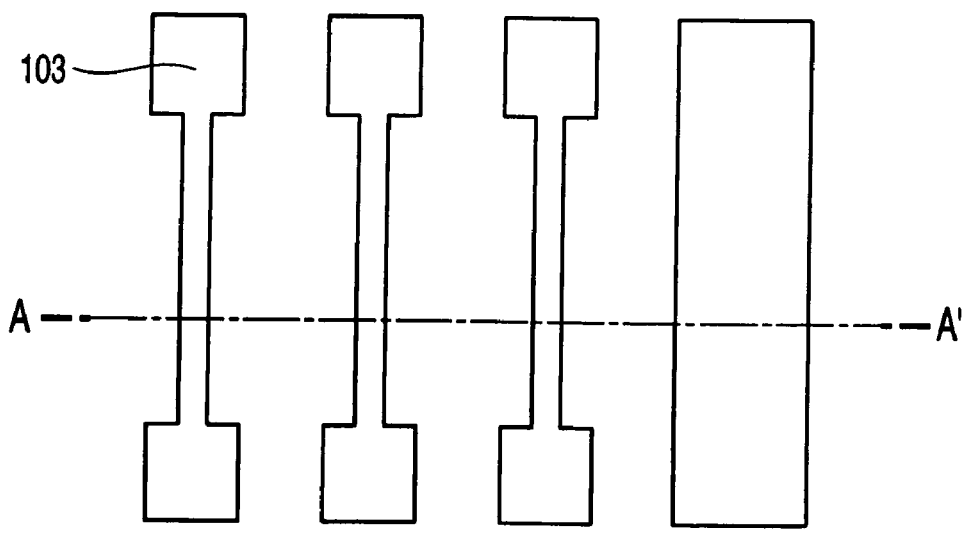
FIGS. 21A and 21B are a plan view and a cross sectional view, respectively, illustrating steps subsequent to the process steps of FIGS. 20A and 20B.
Figure 21B:
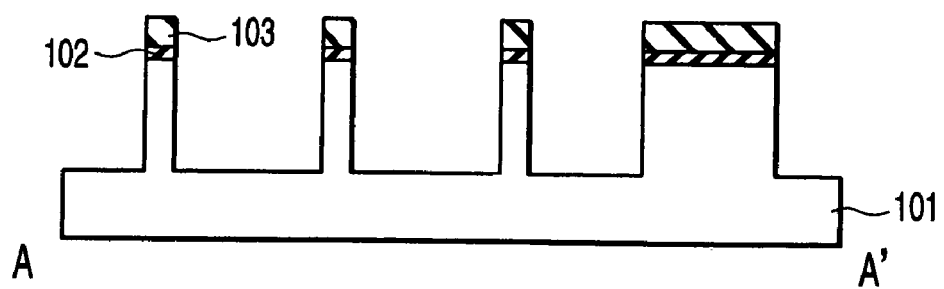

Next, as shown in FIGS. 21A and 21B, the polycrystalline film 203 and the resist film 205 are removed, thereafter, using the silicon nitride film 103 as a mask, the silicon substrate 101 is selectively etched by RIE process to form fin portions having a desired shape.

Here, the method of repeating pattern transfer by combining selective etching characteristics of the resist films 204 and 205, the polycrystalline silicon film 203, the silicon oxide film 102, and the silicon nitride film 103 is described, any other similar method may be used to realize the fin whose width (here 15 nm) is smaller than the minimum dimensions determined by lithography.

The trench that defines the fin portions double as STI (Shallow-Trench Isolation) trench (isolation trench) for isolation. The depth of the trench is for example about 200 nm from the surface of the silicon substrate 101. The width of the STI trenches is for example about 110 nm in the memory cell section. It goes without saying that, since the STI trench is one for isolation, STI trenches of various widths are formed in the surface of the silicon substrate.

Here, an example is given which uses the silicon nitride film 103 on the silicon oxide film 102 is used as the etching mask material of the silicon substrate 101.

Here, an example is given which uses the trench including vertical sidewall, a trench including nonvertical sidewall can be used. For example, a trench including sidewall having angle θ (for example about 85 degrees) such that the width decreases in the direction of depth. Further, the corner at the bottom of the STI trench may be rounded with a radius of about 5 nm (not shown).

With STI trench having such the shape, the filling performance is improved. That is, the STI trench is filled easily with an insulating film (isolation insulating film). Furthermore, concentration of stress on the corner at the bottom of the STI trench is relaxed. Moreover, the subsequent processing of electrode including the side surface of the STI trenches is carried out with ease.

Next, the side surface of the STI trenches formed in the surface of the silicon substrate 101 is oxidized using ordinary thermal oxidation method. As the result, thermal oxide film (not shown) having a thickness of about 2 nm is formed on the side surface of the STI trench.

Here, if the side surface of the STI trench is oxidized by thermal oxidation method using oxygen radicals in place of thermal oxidation method, a silicon oxide film is formed without being affected by the plane orientation of silicon (Si). Therefore, a homogenous, high quality silicon oxide film is formed on the side surface of the STI trench. Alternatively, the side surface of the STI trench may be oxidized by using ISSG (In-Situ Steam Generation) method.

Next, the STI trenches are filled with an insulating film so that the surface is made flat. When the aspect ratio of the STI trench is high, it is recommended that a film of HDP-CVD-$SiO_2$ or a coated film made from polysilazane be used as the insulating film. The point is that the STI trench corresponding to the large STI width and the STI trench corresponding to the small STI width are filled up simultaneously and uniformly.

As the aspect ratio of the STI trench increases, it becomes more difficult to fill the trench with the insulating film. In such a case, the HDP-CVD-$SiO_2$ film alone cannot fill the STI trench well. So a new method of filling the trench will be described below.

FIGS. 22A and 22B illustrate an example of a hybrid STI trench filling technique by which the lower portion of the STI trench is filled with an HDP-CVD-$SiO_2$ 104A and the upper portion is filled with an $SiO_2$ film 104B formed by use of a coating technique.

The filling of the upper portion of the STI trench is performed by forming a film of silazane-perhydride polymer (polysilazane) (hereinafter referred to as the PSZ film) at a thickness of for example about 400 nm on an area including the STI trench by coating method.

After the formation of the PSZ film, a baking process is performed for about three minutes at about 150°C. to volatilize the solvent. The filling performance by the coating technique is good. Thus, the narrow STI trench whose width is about 70 is filled with a PSZ film with no void.

Next, the PSZ film is converted into an $SiO_2$ film 104B. This step can be expressed as

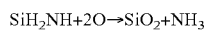

$$SiH_2NH + 2O \rightarrow SiO_2 + NH_3 \qquad (1)$$

That is, the conversion from the PSZ film to the $SiO_2$ film 104B occurs by reacting PSZ film with oxygen (O) produced by decomposition of vapor ($H_2O + O_2$) and $SiO_2$ and $NH_3$ (ammonia gas) are produced.

At this point, the surface of the silicon substrate 101 of the device region is not oxidized because it is covered with the silicon nitride film ($Si_3N_4$) 103.

In order to cause the above chemical reaction, for example, combustion oxidation (hereinafter referred to as BOX oxidation) is performed in a vapor atmosphere at temperatures 200 to 600° C. for about 30 min. For example, if the BOX oxidation is performed for about 30 min. at 400° C., the conversion from the Si—N bond to Si—O bond is assisted in the PSZ film. At the result, the PSZ film filled into each of the STI trenches of various widths is completely converted into the $SiO_2$ film to its bottom.

In the process of BOX oxidation, a so-called two-stage oxidation method may be used which involves performing an oxidation process in a water vapor atmosphere at about 400° C. for about 30 min, thereafter, switching from the water vapor atmosphere to an oxygen atmosphere, elevating the temperature up to about 800° C. (high temperature), and performing an oxidation process in the oxygen atmosphere for about 30 min.

The use of such a two-stage oxidation method allows the efficiency of converting the PSZ film into the $SiO_2$ film 104B to be increased. When the conversion efficiency is increased, impurity, such as carbon (C), remained in the PSZ film is removed.

The two-stage oxidation method is particularly useful in converting the PSZ film into the $SiO_2$ film. It is important that the PSZ film be held in the water vapor atmosphere at a temperature at which conversion from the PSZ film to the $SiO_2$ film begins (for example, 400° C.) for a fixed length of time.

To produce the water vapor atmosphere, hydrogen combustion oxidation may be used to produce a high water vapor content atmosphere. Alternatively, a WVG (Water Vapor Generator) may be used. It is advisable that the waver content be more than 80%.

Thereafter, heat treatment is carried out in an atmosphere of an inert gas, such as nitrogen, at a arbitrary temperature in the range of 700 to 1000° C., for example, at 850° C. for about 30 min. By the heat treatment (densification process), remained $NH_3$ and $H_2O$ in the $SiO_2$ film 104B ($SiO_2$ film converted from the PSZ film) are released, and the $SiO_2$ film 104B is densified. As the result, leakage current in the $SiO_2$ film 104B is reduced.

Next, a heating process is carried out in an oxygen atmosphere at about 800° C., and the concentration of impurity, such as carbon (C), in the $SiO_2$ film 104B is reduced. As the result, the leakage current is further reduced and fixed electric charges at the interface of the $SiO_2$ film 104B and the silicon substrate 101 are reduced. The heat treatment used in the process of densification of the $SiO_2$ film 104B may be normal furnace-based heat treatment. Alternatively, RTA (Rapid Thermal Annealing) or RTO (Rapid Thermal Oxidation) may be used. In a case where RTA is used, heat treatment can be carried out at a higher temperature and in a shorter time in comparison with the normal furnace-based heat treatment.

Next, as shown in FIG. 22B, by using CMP (Chemical Mechanical Polishing) the $SiO_2$ films 104A and 104B are planarized and the surface of the silicon nitride film 103 is exposed. After the planarization by CMP, heat treatment may be carried out in an nitrogen ($N_2$) atmosphere at 850° C.

Figure 23A:
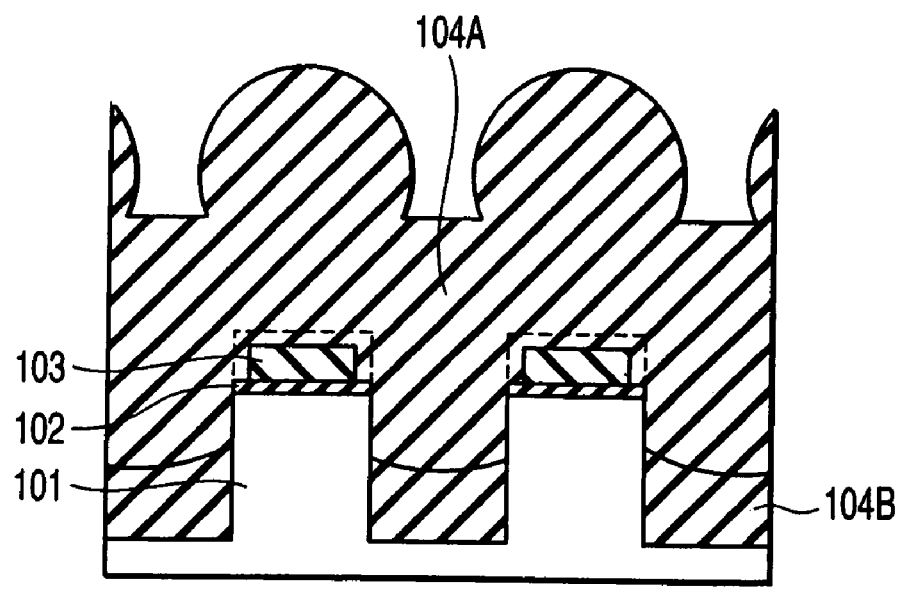
FIGS. 23A and 23B are cross sectional views for use in explanation of another example of a hybrid STI filling technique.
Figure 23B:
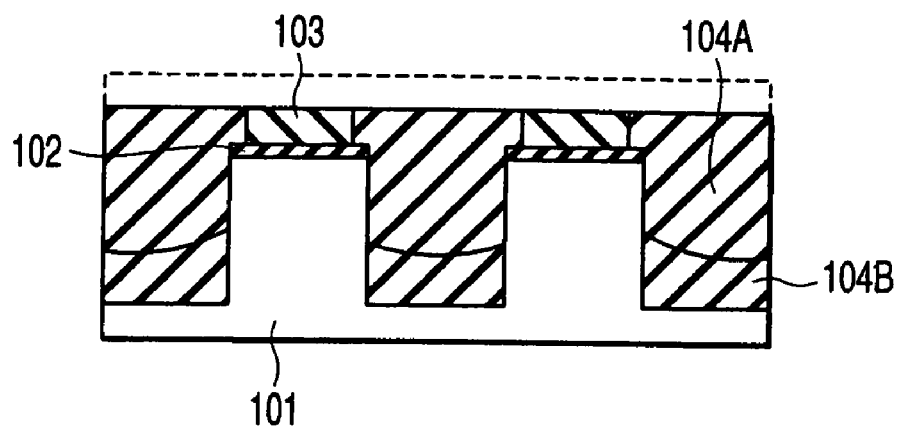

The STI trench may be filled with the coated film alone. The order in which the films are filled into the trench may be changed. For example, as shown in FIGS. 23A and 23B, a coated film, such as a PSZ film, is formed in the STI trench, thereafter, proper heat treatment is carried out to convert the PSZ film into the $SiO_2$ film 104B, further, the HDP-CVD-$SiO_2$ film 104A is formed on the $SiO_2$ film 104B so that the STI trench are filled up. After that, the surface is planarized by the CMP process or like that.

As the STI trench width decreases from 110 nm to 70 nm or 50 nm, further to 40 nm, it becomes more difficult to fill the STI trench with the HDP-$SiO_2$ film. How to fill fine STI trench is an important problem in manufacturing process.

To solve the problem, FIGS. 4A-4F illustrate an STI trench filling method using a so-called pull-back process. That is, as shown in FIG. 4E, prior to the process of filling the trench with the isolation insulating film 104, a desired area, for example, a control circuit area is exposed and an etching process is performed in a condition that other areas is masked with a resist layer (not shown), and the silicon nitride film 103 is pull back by about 10 nm.

For the etching process, a hot phosphoric acid solution at a temperature of about 160° C. or down flow etching that is isotropic dry etching is used. As the resist layer, a resist layer having high heat resistance and high adhesion is used. The down flow etching is performed after the side surface of the STI trench has been covered with the oxide film. Of course, the STI trench may be filled without using the pull-back process.

Next, the isolation insulating film 104 is formed over the entire surface so that the STI trench is filled up, thereafter, the surface of the isolation insulating film 104 is polished by the CMP process so that it is at nearly the same height as the isolation insulating film 103.

Next, a resist film 105 is formed on areas other than areas where fin FETs are to be formed in the memory cell section and then the isolation insulating film 104 is etched by dry etching using, for example, a $CF_4$-based gas (recess etching) with the resist film 105 and the silicon nitride film 103 as a mask. As the result, the surface of the isolation insulating film 104 becomes about 100 nm lower than the surface of the silicon substrate 101. After that, $O_2$ ashing or DHF-based etching is performed to remove damages which have been induced in the sidewall of the STI trench by the dry etching process.

Next, the resist film 105 is removed, thereafter, the process of manufacturing the fin FETs is performed. Hereinafter, the process of manufacturing the fin FETs including gate insulating films having a plurality of thicknesses will be described.

First, as shown in FIGS. 5A-5F, the side surface of the fin portion is exposed and a gate insulating film 106S is formed on the exposed area of the side surface of the fin portion. Here, a silicon oxide film with a thickness of about 10 nm is used as the gate insulating film 106S. The silicon oxide film is formed by oxidation.

Next, a resist film (not shown) is formed by using the ordinary lithography process, thereafter, the gate insulating film 106S in a desired area is etched away by the wet etching process using the resist film as a mask, and the side surface of the STI trench (the silicon substrate 101) in the desired area is exposed.

Next, the resist film is removed, thereafter, a tunnel insulating film (gate insulating film) 106T is formed on the side surface of the STI trench by oxidation. The thickness of the tunnel insulating film 106T is for example about 7 nm. The thickness of the gate insulating film 106s is changed from about 10 to 14 nm by the oxidation. In this way, the gate insulating film 106S, 106T having a plurality of thickness are obtained.

The silicon oxide film serving as the gate insulating films 106S, 106T may be converted into an oxy-nitride film by using a nitriding gas containing $NH_3$, $NO_2$ or like that. As the gate insulating film, the oxy-nitride film is higher in reliability than the silicon oxide film. The silicon oxide film serving as the gate insulating film 106S, 106T is formed by thermal oxidation or oxidation using oxygen radicals for instance. In the case of oxidation using oxygen radicals, the silicon oxide film is not affected by the plane orientation of the underlying silicon substrate which is the side surface of the STI trench. Therefore, a homogeneous and high quality silicon oxide film is formed.

Next, as shown in FIGS. 6A-6F, a first polycrystalline silicon film to be processed into the FG electrode 107 is formed by LP-CVD process on the memory cell area in which the isolation insulating film has been recess etched. The thickness of the first polycrystalline silicon film is for example about 20 nm.

Next, the entire surface of the first polycrystalline silicon film is overetched by an anisotropic dry etching process (for example, the RIE process), whereby the FG electrode 107 is formed on the sidewall of the fin portion.

Here, when the first polycrystalline silicon film undergoes overetching, the surface of the silicon substrate 101 is prevented from being etched because the surface of the fin portion is protected by the silicon nitride film 103.

Next, as shown in FIGS. 7A-7F, an interpoly insulating film 108 is formed on the exposed surface of the FG electrode 107. As the interpoly insulating film 108, an ONO film (oxide film/nitride film/oxide film) or a high-k insulating film of an $Al_2O_3$ (alumina) film formed by the ALD (Atomic Layer Deposition)-CVD process can be used. The thickness of the alumina film is for example about 14 nm.

Next, the interpoly insulating film 108 in areas other than the areas where memory cells having the FG floating gate structure are formed, for example, the interpoly insulating film 108 in the areas where the select transistors and the control circuit are formed is selectively etched away by the etching process using a resist layer (not shown) formed by ordinary lithography process as a mask.

Here, the $Al_2O_3$ film is mentioned as an example of the high-k insulating film. The leakage current in the $Al_2O_3$ film is suppressed by subjecting it to heat treatment after the formation thereof.

As the high-k film, not only a monolayer film but also a laminated film of $Si_3N_4$ (2 nm)/$Al_2O_3$ (12 nm), $Si_3N_4$ (1.5 nm)/$Al_2O_3$ (13 nm)/$Si_3N_4$ (1.5 nm), or $Al_2O_3$ (2 nm)/$HfO_2$/$Al_2O_3$ or like that can be used. The values in the parentheses indicate the thicknesses.

An SiON film (for example about 1.5 nm thickness) having a relative permittivity in a range of about 5.5 to 6.0 can be used in place of the $Si_3N_4$ film. The use of such a multi-layered structure allows the dielectric strength of the interpoly insulating film to be improved.

In addition to the above examples, the following can be used as the interpoly insulating film.

First, a hafnium oxide ($HfO_2$) film can be used in place of the $Al_2O_3$ film. The permittivity of the $HfO_2$ film is about 20. Thus, even if the area of the $HfO_2$ film is small, it is possible to ensure a large capacitance. As the others, a single (monolayer) of $Si_3N_4$ (permittivity about 8), a laminated film of $Si_3N_4$ (about 2 nm)/$Ta_2O_5$ (about 20 nm)/$Si_3N_4$ (about 2 nm), a laminated film of $Si_3N_4$ (about 2 nm)/$SrTiO_3$ (about 30 nm)/$Si_3N_4$ (about 2 nm), a laminated film of $HfO_2$ (about 10 nm)/ALD-Al$_2$O$_3$ (about 3 nm), a laminated film of Si$_3$N$_4$ (about 2 nm)/Nb-doped Ta$_2$O$_5$ (about 20 nm)/Si$_3$N$_4$ (about 2 nm), a laminated film of Si$_3$N$_4$ (about 2 nm)/Ti-doped Ta$_2$O$_5$ (about 20 nm)/Si$_3$N$_4$ (about 2 nm), a laminated film of Si$_3$N$_4$ (about 2 nm)/barium strontium titan oxide (Ba, Sr) TiO$_3$ (about 20 nm)/Si$_3$N$_4$ (about 2 nm), and a laminated film of HfO$_2$ (10 nm)/Al$_2$O$_3$ (5 nm)/SiON (1 nm). Thus, various high-k insulating films can be used in combination as the interpoly insulating film, which allows the CG-to-FG capacitance to be increased.

Next, as shown in FIGS. 8A-8F, the second polycrystalline silicon film processed into the CG electrode 109 is formed over the entire surface. The thickness of the second polycrystalline silicon film is for example about 40 nm. Though not shown directly in the diagrams, the first polycrystalline silicon film in the select transistor area is connected with the second polycrystalline silicon film through electrically low resistance because the interpoly insulating film 108 has been removed.

Next, as shown in FIGS. 9A-9F, the exposed silicon nitride film 103 is removed by a hot solution of phosphoric acid. After that, the unnecessary insulating film 106S, 106T remaining on the surface is removed by the CMP process for instance.

Next, the memory cell area including the select transistors and the storage elements is masked by a resist layer 110 formed by ordinary lithography process. After that, the polycrystalline silicon film 109, the silicon nitride film 103 and the silicon oxide film 102 in the area where the control circuit and planar transistors are to be formed are removed in sequence by etching to expose the surface of the silicon substrate 101. As can be seen from FIGS. 9E and 9F, the thick isolation insulating film 104 has been buried without being etched back in the STI area of the control circuit section. The silicon nitride film 103 can be removed by wet etching using a hot solution of phosphoric acid. After that, the unnecessary insulating film 106S, 106T remaining on the surface is removed by the CMP process for instance.

Next, as shown in FIGS. 10A-10F, a gate insulating film 111 for the control circuit section is formed on the exposed surface of the silicon substrate 101. The gate insulating film 111 is also formed on the surface of the CG electrode 109.

It is abbreviated here, if necessary, the gate insulating film 111 having a plurality of different thicknesses may be formed. For example, in the control circuit section demanding high-speed operation, the gate insulating film may be formed at a thickness of about 4 nm. In the high-voltage circuit section demanding high-voltage withstanding property, the gate insulating film 111 may have a thickness of about 40 nm. The formation of the gate insulating film at different thicknesses can be achieved by combining the ordinary lithography process for resist layer formation, the wet etching process, and the oxide forming process.

Next, as shown in FIGS. 11A-11F, a polycrystalline silicon film to be processed into a planar gate electrode 112 in the control circuit section is formed at a thickness of about 40 nm, an insulating film such as an oxide film (SiO$_2$ film) of the thickness about 30 nm to be processed into a cap insulating film 113 is formed on the polycrystalline silicon film, thereafter, using the resist layer 114 formed by ordinary lithography process as a mask, the insulating film and the polycrystalline silicon film are etched by RIE process to form the cap insulating film 113 and the gate electrode 112 in the control circuit section.

Next, as shown in FIGS. 12A-12F, an oxide film (not shown) is formed on the sidewall of the gate electrode 112, thereafter, extension layers (lightly-doped source/drain diffusion layers) of the transistor in the control circuit section are formed by ion implantation and activation annealing process for instance.

Next, a silicon nitride film 116 is formed over the entire surface. The thickness of this film is for example about 20 nm.

After that, using a resist layer (not shown) formed by ordinary lithography process as a mask, the patterning of the CG electrodes 109 of the storage elements and the select transistors is performed.

More specifically, the silicon nitride film 116 is etched by using the resist layer as a mask, the cap insulating film 113, the CG electrode 109, the interpoly insulating film 108 and the FG electrode 107 are etched in sequence by RIE process using the etched silicon nitride film 116 as a mask.

Here, the fin portion has a step (about 140 nm), by optimizing the overetching amount, unnecessary CG and FG electrodes 109 and 107 on the sidewall of the fin portion are removed. As can be seen from FIGS. 12D-12F, the control circuit section is covered with the silicon nitride film 116, then, the control circuit section is protected against the etching.

Next, as shown in FIGS. 13A-13F, the silicon nitride film 116 is etched by RIE process to remove the silicon nitride film in areas other than the sidewall of the gate electrode 112. That is, the sidewall insulating film 116 comprising silicon nitride is formed on the sidewall of the gate electrode 112.

When the silicon nitride film 116 is etched by RIE process, the silicon nitride film 103 on the memory cell section will also be etched simultaneously. For this reason, it is recommended that the RIE process be performed under conditions that the etching rate of the silicon oxide film 102 underlying the silicon nitride film 103 is sufficiently low.

Next, using a resist layer (not shown) formed by ordinary lithography process as a mask, N-type impurity ions are implanted into the surface of the silicon substrate 101 by ion implantation process, thereafter, the impurity ions are activated by annealing, and N-type source/drain diffusion layers 115 are selectively formed in the memory cell area.

The fin portion in the present embodiment is such that an island insulating film (silicon oxide film 102, silicon nitride film 103) is provided on the island silicon portion. For this reason, the fin portion of the present embodiment is higher than a fin portion with no island insulating film by the thickness of the island insulating film. As the result, the area of the side surface of the fin portion of the present embodiment becomes larger than that of the fin with no island insulating film by the amount corresponding to the island insulating film. Therefore, according to the present embodiment, the area of the interpoly insulating film 108 between the FG electrode 107 and the CG electrode 109 can be increased without increasing the memory cell area. Increasing the area of the interpoly insulating film 108 results in an increase in the capacitance C2, improving the coupling ratio C2/(C1+C2). As the result, the write voltage is lowered.

The fin FET of the present embodiment comprises a structure such that MOS gates are provided on two side surfaces of the fin portion (double-gate structure). The area of the channel regions in the surface of the two sides of the fin portion is larger than that of a normal channel region in the surface of a silicon substrate. For this reason, even if the cell area is reduced, the cell current is prevented from lowering. Thereby, even if the cell area is made small, the current required for reading the memory cell will be ensured.

Depletion occurs from each of the two side surfaces of the fin portion, the channel region is completely depleted. Therefore, even if the gate length (Lg) becomes short, for example, less than 50 nm, the SCE is suppressed. In addition, owing to the Fin FET structure, even if the gate oxide film is relatively thick, for example about 6 nm, the SCE is suppressed.

The FG electrodes 107 in the A-A' direction are shielded by the CG electrode 109. Moreover, in the present embodiment, since the FG electrodes 107 are made small in thickness, the spacing between the FG electrodes is large. Accordingly, since the region between the FG electrodes 107 is filled with the CG electrode 109 which is relatively thick, the shielding effect by the CG electrode increases. By the shielding effect, the interaction (the Yupin effect) between adjacent FG electrodes 107 is reduced. When the Yupin effect is reduced, the cell operation becomes stabilized. As the result, the product manufacturing yield is improved.

Next, as shown in FIGS. 14A-14F, an insulating film, such as an oxide film to be processed into the sidewall insulating film (spacer) 109 of the gate electrode is formed over the entire surface. The thickness of the insulating film is for example about 30 nm.

Suppose here that, when the thickness of the insulating film is 30 nm, the spacing between two adjacent CG electrodes 109 is not more than 60 nm. Then, the region between these CG electrodes will be completely filled with the insulating film. In this state, impurity ions cannot be implanted into the surface of the silicon substrate 101, then, highly doped source/drain diffusion layers are not formed in the next step.

Thus, when the region between two adjacent CG electrodes 109 is completely filled with the insulating film, the portions of the insulating film located over regions where the highly doped source/drain diffusion layers are to be formed are removed, and the surface of the silicon substrate 101 is exposed.

Next, a silicon oxide film 119 is formed on the exposed surface of the silicon substrate 101. The thickness of this silicon oxide film is small, for example about 10 nm. The silicon oxide film 119 is formed by thermal oxidation for instance.

Next, using a resist layer (not shown) formed by ordinary lithography process as a mask, N and P-type impurity ions are implanted through the silicon oxide film 119 into the surface of the silicon substrate 101 by the ion implantation process.

After that, the implanted impurity ions are activated by annealing, and highly doped N-type source/drain diffusion layers 120 and highly-doped P-type source/drain diffusion layers (not shown).

Though not shown here, a halo implantation process may be performed to prevent the punch-through of transistors in the control circuit section. When the gate electrode decreases in length, layers formed by the halo ion implantation process come to overlap with each other. Even in such a case, by optimizing the ion dose, good transistor characteristics can be realized. In addition, impurity layers for preventing the punch-through of transistors may be formed by the ion implantation process using the gate electrode as a mask.

Next, as shown in FIGS. 15A-15F, an interlayer insulating film 121 is formed over the entire surface by CVD process. After that, bit-line contact plugs 122, bit lines 123, an interlayer insulating film 124, contact plugs 125 and an interconnect layer 125 are formed sequentially. Though not shown, a passivation film, pads, and so on are then formed to finish a semiconductor memory device.

In the present embodiment, polycrystalline silicon is used as the material of the gate electrode, of course, a laminated film such as a polycide film (e.g., laminated $WSi_2$/polysilicon film, laminated $CoSi_2$/polysilicon film, etc.) or poly-metal films (e.g., laminated W/WN/polysilicon film, etc.) may be used.

Second Embodiment

FIGS. 24A-24F are plan views and cross sectional views of a NAND flash memory according to the second embodiment of the present invention. In these diagrams and subsequent diagrams, corresponding parts to those in the previous diagrams are denoted by the same reference numerals and detailed descriptions thereof are omitted.

FIGS. 24A-24F correspond to FIGS. 15A-15F of the first embodiment. The present embodiment differs from the first embodiment in that an SOI (silicon on insulator) substrate is used.

The SOI substrate in the present embodiment comprises a silicon substrate 101, a BOX (Buried Oxide) layer 211 as an insulating layer provided on the silicon substrate 101, and a silicon layer 212 with a thickness of for example 200 nm provided on the BOX layer 211. The thickness of the silicon layer 212 may be about 100 nm.

The use of the SOI substrate in place of a bulk silicon substrate allows process steps associated with STI (isolation insulating films) to be simplified. Moreover, since the bottom of each fin FET is completely covered with the insulating film, the punch-through that occurs there is prevented. In addition, the present embodiment provides the same advantages as the first embodiment. The method of manufacturing the NAND flash memory of the present embodiment remains unchanged from that in the first embodiment except that the SOI substrate is used instead of a bulk silicon substrate.

Third Embodiment

Figure 25:
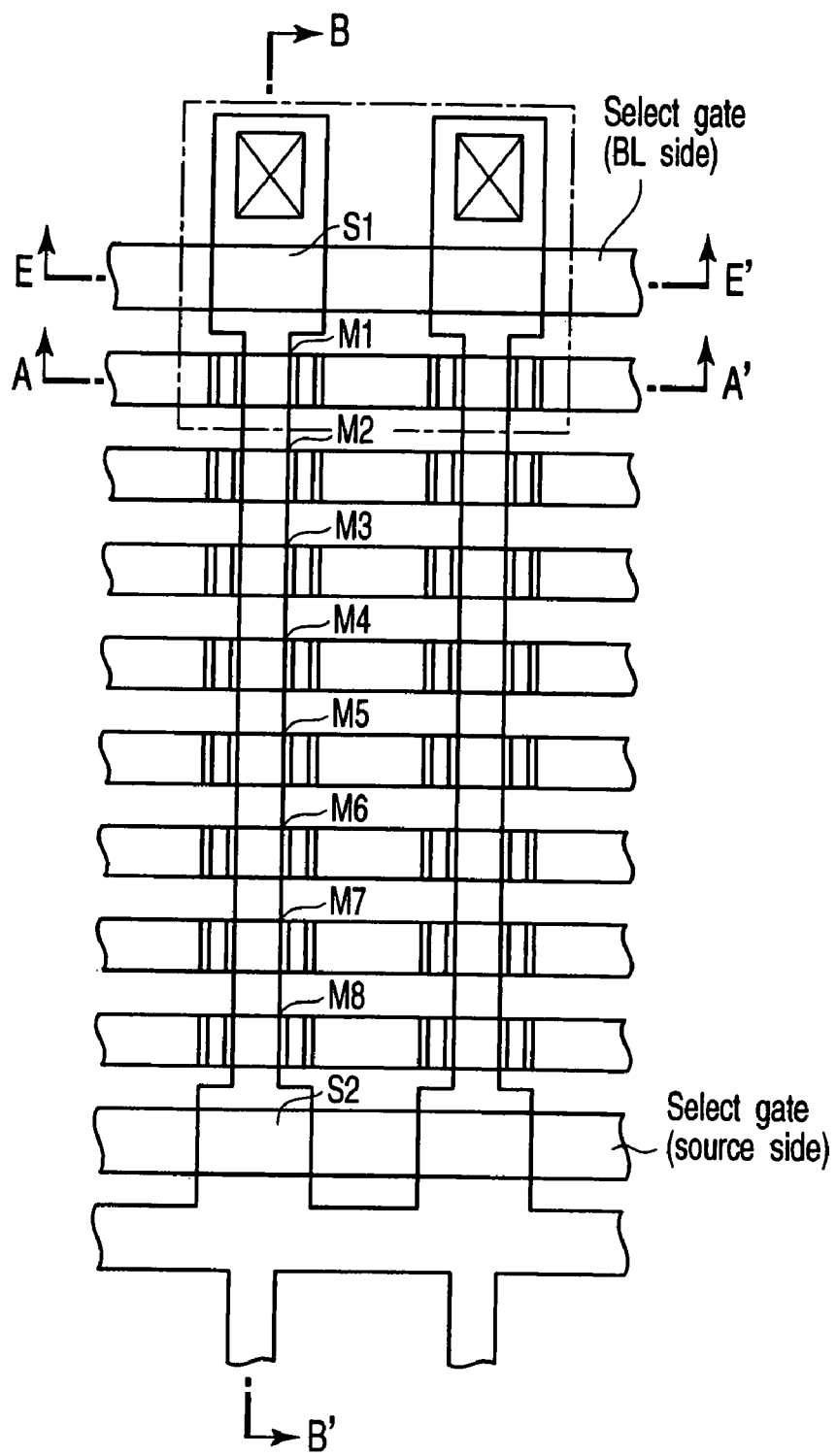
FIG. 25 is a plan view of a NAND flash memory according to the third embodiment of the present invention.
Figure 26:
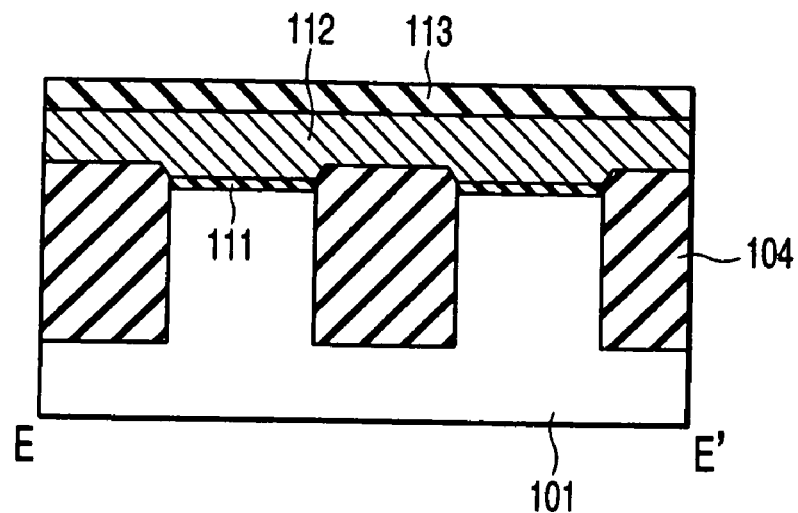
FIG. 26 is a cross sectional view taken along line E-E' of FIG. 25.
Figure 27:
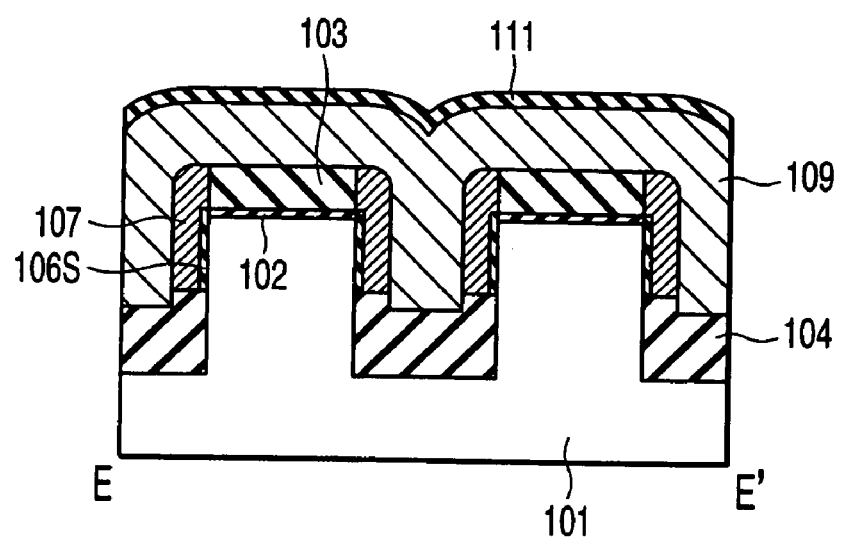
FIG. 27 is a cross sectional view taken along line A-A' of FIG. 25 corresponding to the cross sectional view taken along line E-E" of FIG. 25.

FIGS. 25 and 26 are a plan view and a cross sectional view, respectively, of a NAND flash memory according to the third embodiment of the present invention. FIG. 26 is a cross sectional view taken long line E-E' of FIG. 25. The cross sectional view of the memory cell in the FIG. 1A (the first embodiment) corresponding to the E-E' cross sectional view is illustrated in FIG. 27.

The present embodiment differs from the first embodiment in that conventional planar FETs are used in place of fin FETs as the transistors in the select transistor section.

In the first embodiment, since fin FETs are used as the transistors in the select transistor section, the FG electrode 107 and the polycrystalline silicon film 109 which are electrically connected with each other are formed over the side surface of the fin portion of each select transistor with the gate insulating film 106S interposed therebetween.

On the other hand, in the present embodiment, the AA width is taken greatly and as in the control circuit section, even in the select transistor section, the gate electrode 112 is formed via the gate insulating film 111 By so doing, the transistors in the select transistor section are formed in the same manner as the select transistors in the control circuit section. Thereby, the setting of the threshold voltage of the transistors in the select transistor section is performed in the same manner as with the select transistors in the control circuit section.

Figure 28:
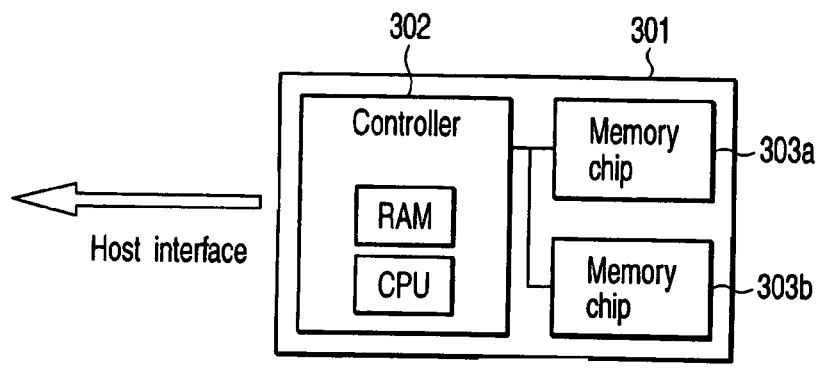
FIG. 28 is a schematic illustration of a memory card comprising the NAND flash memory of the embodiment.
Figure 29:
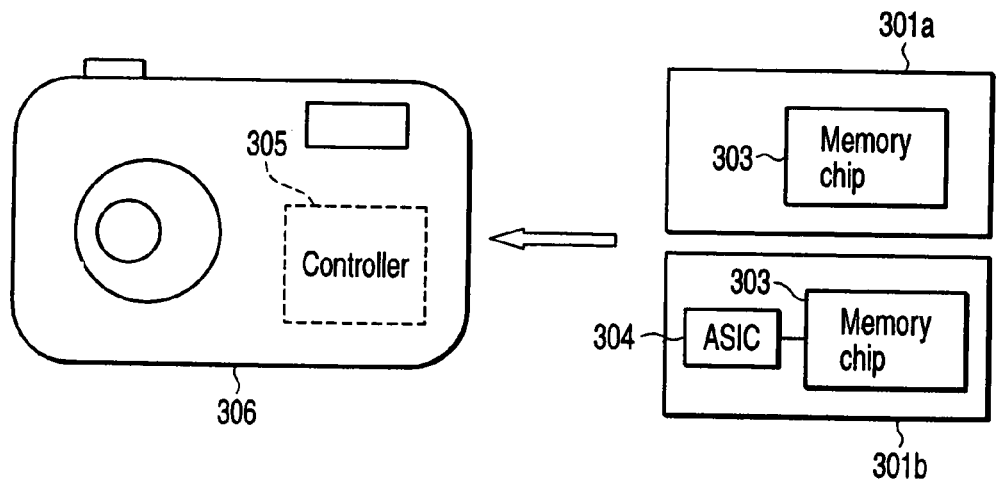
FIG. 29 is a schematic illustration of a memory card without the NAND flash memory of the embodiment.
Figure 30:
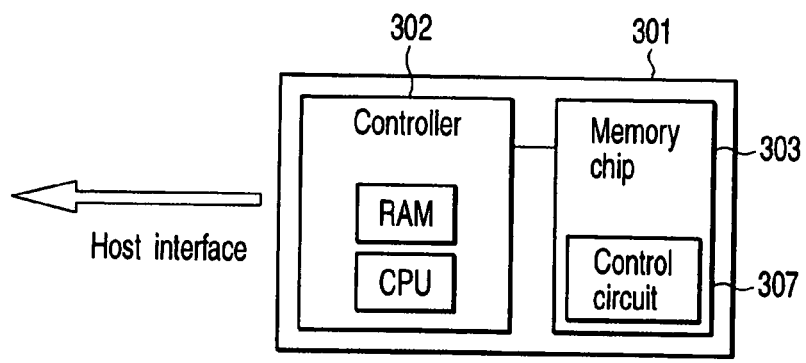
FIG. 30 is a schematic illustration of a memory chip comprising the controller of the embodiment.

FIGS. 28-30 illustrate specific examples of devices comprising the NAND flash memory of the embodiment.

FIG. 28 illustrates a memory card comprising a controller and embedded chips. A controller 302 and a plurality of memory chips 303a and 303b are mounted on the memory card 301. The memory chips 303a and 303b comprises is the NAND flash memory of the embodiment.

Host interface is for example an ATA interface, a PC card interface, a USB or like that. The other interface except those interfaces may be used. The controller 302 comprises a RAM and a CPU. The controller 302 and the memory chips 303a and 303b may be integrated into one chip. Otherwise, each of them may be formed into a separate chip.

FIG. 29 shows a memory card of the embodiment on which no controller is mounted. This example is directed to a card 301a having only a memory chip 303 mounted or a card 301b having the memory chip 303 and a relatively small-scale logic circuit (ASIC) 304 mounted. The memory chip 303 contains the NAND flash memory of the embodiment. The equipment to which the card 301a or 301b is connected is a digital camera 306 having a controller 305 mounted.

FIG. 30 shows a memory chip of the embodiment on which a control circuit mounted. A controller 302 and memory chip 303 are mounted on the memory card 301. The memory chip 303 includes a control circuit 307.

The present invention is not limited to the embodiments described so far. For example, although the embodiments have been described in terms of NAND-type semiconductor memory device, the invention i also applicable to NOR-type semiconductor memory device. The method of manufacturing NOR-type semiconductor memory device remains basically unchanged from those for NAND-type semiconductor storage devices except the connection relationship among transistors. For this reason, even with NOR-type flash memories, the same advantages as with NAND-type flash memories can be expected.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device comprising:

forming an island semiconductor portion comprising a first side surface and a second side surface opposed to the first side surface in a main surface of a semiconductor substrate or above the semiconductor substrate by forming a trench in the main surface of the semiconductor substrate;

forming a first insulating film on a top surface of the island semiconductor portion;

forming a second insulating film on the first and second side surfaces of the island semiconductor portion forming a first conductive film on a region including the island semiconductor portion, the first insulating film, and the second insulating film;

forming a charge storage layer selectively on a side surface of the first insulating film and a side surface of the second insulating film by overall etching of the first conductive film such that the first conductive film remains on both the side surface of the first insulating film and the side surface of the second insulating film, the charge storage layer comprising a first sidewall provided on the first side surface of the island semiconductor portion and a second sidewall provided on the second side surface of the island semiconductor portion;

forming a third insulating film on the charge storage layer; and forming a control gate electrode on the third insulating film.

2. The method according to claim 1, wherein the second insulating film is a tunnel insulating film.

3. The method according to claim 2, wherein the tunnel insulating film includes a laminated film including a silicon oxide film and silicon nitride film or an aluminum oxide film.

4. The method according to claim 1, wherein the third insulating film is a monolayer oxide film including Al, Ta, Ti, Sr, Hf, or Zr, a laminated film including at least two of the monolayer oxide film, a laminated film including the monolayer oxide film and a silicon oxide film, a laminated film including the monolayer oxide film and a silicon nitride film, a laminated film including the laminated film including the at least two of the monolayer oxide film and a silicon oxide film, or a laminated film including the laminated film including the at least two of the monolayer oxide film and a silicon nitride film.

5. The method according to claim 1, wherein the island semiconductor portion is surrounded by the trench.

6. The method according to claim 1, further comprising forming source/drain diffusion layers in the main surface.

* * * * *